US011302855B2

(12) United States Patent
Kocevski et al.

(10) Patent No.: US 11,302,855 B2
(45) Date of Patent: Apr. 12, 2022

(54) HIGH-EFFICIENCY TWO-PHASE HEUSLER THERMOELECTRIC MATERIALS

(71) Applicant: Northwestern University, Evanston, IL (US)

(72) Inventors: Vancho Kocevski, Chicago, IL (US); Christopher M. Wolverton, Evanston, IL (US)

(73) Assignee: Northwestern University, Evanston, IL (US)

( * ) Notice: Subject to any disclaimer, the term of this patent is extended or adjusted under 35 U.S.C. 154(b) by 205 days.

(21) Appl. No.: 16/351,887

(22) Filed: Mar. 13, 2019

(65) Prior Publication Data

US 2019/0288173 A1 Sep. 19, 2019

Related U.S. Application Data

(60) Provisional application No. 62/642,144, filed on Mar. 13, 2018.

(51) Int. Cl.
*H01L 35/26* (2006.01)
*H01L 35/22* (2006.01)
(Continued)

(52) U.S. Cl.
CPC ............. *H01L 35/26* (2013.01); *H01L 35/18* (2013.01); *H01L 35/20* (2013.01); *H01L 35/22* (2013.01)

(58) Field of Classification Search
None
See application file for complete search history.

(56) References Cited

FOREIGN PATENT DOCUMENTS

JP 2010226034 A * 10/2010
WO WO-2013024328 A1 * 2/2013 ............ H01L 35/26

OTHER PUBLICATIONS

Lemal et al., First principles study of heavily doped full Heusler Fe2YZ for high TE power factor, May 2, 2016 (Year: 2016).*

(Continued)

*Primary Examiner* — Shannon M Gardner
(74) *Attorney, Agent, or Firm* — Bell & Manning, LLC

(57) ABSTRACT

A thermoelectric material may be composed of an isostructural pair of Heusler compounds, either a pair of full Heusler (FH) $X_2YZ$ compounds or a pair of half Heusler (HH) XYZ compounds. In the FH pair, a first compound of the pair may the formula $(X1)_2Y1Z1$, wherein X1 is selected from Fe and Co; Y1 is selected from Ti, V, Nb, Hf, and Ta; and Z1 is selected from Al, Ga, Si, and Sn and a second compound of the pair has the formula $(X2)_2Y2Z2$, wherein X2 is selected from Mn, Fe, Co, Ru, and Rh; Y2 is selected from Ti, V, Mn, Zr, Nb, Hf, and Ta; and Z2 is selected from Be, Al, Ga, Si, Ge and Sn. The first and second compounds of the pair may share two elements in common and have third elements which are different and are either isovalent or have a valency which differs by ±1. In the HH pair, a first compound of the pair may have the formula X1Y1Z1 wherein X1 is selected from Ni and Fe; Y1 is selected from Ti, V, and Nb; and Z1 is selected from Sn and Sb and a second compound of the pair has the formula X2Y2Z2 wherein X2 is selected from Fe, Ru and Pt; Y2 is selected from Ti, V, and Nb; and Z2 is selected from Sn and Sb. The first and second compounds of the pair may share two elements in common and have third elements which are different and are either isovalent or have a valency which differs by ±1. The thermoelectric material at room temperature may have a nanostructured two-phase form having a matrix phase composed of the first compound of the FH pair or the first compound of the HH pair and a (Continued)

nanostructured phase composed of the second compound of the FH pair or the second compound of the HH pair, respectively.

23 Claims, 9 Drawing Sheets

(51) Int. Cl.
*H01L 35/20* (2006.01)
*H01L 35/18* (2006.01)

(56) References Cited

OTHER PUBLICATIONS

JP-2010226034 Eng Abstract (provided with JP ref) (Year: 2010).*
S. Bhattacharya, et al., "Effect of Sb doping on the thermoelectric properties of Ti-based half-Heusler properties of Ti-based half-Heusler compounds, TiNiSn$_{1-x}$SB$_x$," Appl. Phys. Lett. 2000, vol. 77, pp. 2476-2478.
Q. Shen et al., "Effects of partial substitution of Ni by Pd on the thermoelectric properties of ZrNiSn-based half-Heusler compounds," Appl. Phys. Lett. 2001, vol. 79, pp. 4165-4167.
N. Shutoh et al., "Thermoelectric properties of the Ti$_x$(Zr$_{0.5}$Hf$_{0.5}$)$_{1-x}$NiSn half-Heusler compounds," J. Alloys Compd. 2005, vol. 389, pp. 204-208.
S. Sakurada et al., "Effect of Ti substitution on the thermoelectric properties of (Zr,Hf)NiSn half-Heusler compounds," Appl. Phys. Lett. 2005, vol. 86, pp. 082105-082107.
S. Culp et al., "Effect of substitutions on the thermoelectric figure of merit of half-Heusler phases at 800° C.," Appl. Phys. Lett. 2006, vol. 88, pp. 042106-042108.
C. Yu et al., "High-performance half-Heusler thermoelectric materials Hf$_{1-x}$Zr$_x$NiSn$_{1-y}$Sb$_y$ prepared by levitation melting and spark plasma Sintering," Acta Mater. 2009, vol. 57, pp. 2757-2764.
G. Joshi et al., Enhancement in Thermoelectric Figure-Of-Merit of an N-Type Half-Heusler Compound by the Nanocomposite Approach, Adv. Energy Mater. 2011, vol. 1, pp. 643-647.
H. Xie et al., Beneficial Contribution of Alloy Disorder to Electron and Phonon Transport in Half-Heusler Thermoelectric Materials. Adv. Funct. Mater. 2013, vol. 23, pp. 5123-5130.
Bhardwaj et al., "Panoscopically optimized thermoelectric performance of a half-Heusler/full-Heusler based in situ bulk composite Zr$_{0.7}$Hf$_{0.3}$Ni$_{1+x}$Sn: an energy and time efficient way," Phys. Chem. Chem. Phys. 2015, vol. 17, pp. 30090-30101.
Birkel et al., "Improving the thermoelectric properties of half-Heusler TiNiSn through inclusion of a second full-Heusler phase: microwave preparation and spark plasma sintering of TiNi$_{1+x}$Sn.," Phys. Chem. Chem. Phys. 2013, vol. 15, pp. 6990-6997.
Bhardwaj et al., Implications of nanostructuring on the thermoelectric properties in half-Heusler alloys. Appl. Phys. Lett. 2012, vol. 101, pp. 133103-133107.
Y. Liu et al., "Large Enhancements of Thermopower and Carrier Mobility in Quantum Dot Engineered Bulk Semiconductors," J. Am. Chem. Soc. 2013, vol. 135, pp. 7486-7495.
Makongo et al., "Simultaneous Large Enhancements in Thermopower and Electrical Conductivity of Bulk Nanostructured Half-Heusler Alloys," J. Am. Chem. Soc. 2011, vol. 133, pp. 18843-18852.
S. Bhattacharya et al., "Effect of boundary scattering on the thermal conductivity of TiNiSn-based half-Heusler alloys," Phys. Rev. B: Condens. Matter Mater. Phys. 2008, vol. 77, pp. 184203-184210.
O. Appel et al., "Effects of Microstructural Evolution on the Thermoelectric Properties of Spark-Plasma-Sintered Ti$_{0.3}$Zr$_{0.35}$Hf$_{0.35}$NiSn Half-Heusler Compound," J. Electron. Mater. 2013, vol. 42, pp. 1340-1345.
M. Schwall et al., "Phase separation as a key to a thermoelectric high efficiency," Phys. Chem. Chem. Phys. 2013, vol. 15, pp. 1868-1872.
S. Populoh et al., "A. High figure of merit in (Ti,Zr,Hf)NiSn half-Heusler alloys," Scr. Mater. 2012, vol. 66, pp. 1073-1076.

Y. Xia et al., "Thermoelectric properties of semimetallic (Zr,Hf)CoSb half-Heusler phases," J. Appl. Phys. 2000, vol. 88, pp. 1952-1955.
Y. Kawaharada et al., "High temperature thermoelectric properties of CoTiSb half-Heusler compounds," J. Alloys Compd. 2004, vol. 384, pp. 308-311.
T. Sekimoto et al., "Thermoelectric properties of Sn-doped TiCoSb half-Heusler compounds," J. Alloys Compd. 2006, vol. 407, pp. 326-329.
M. Zhou et al., "Moderate temperature thermoelectric properties of TiCoSb-based half-Heusler compounds Ti1−xTaxCoSb.," J. Appl. Phys. 2007, vol. 101, pp. 113714-113717.
T. Wu et al., "Thermoelectric properties of p-type Fe-doped TiCoSb half-Heusler compounds," J. Appl. Phys. 2007, vol. 102, pp. 103705-103709.
V. Ponnambalam et al., "Thermoelectric properties of p-type half-Heusler alloys Zr1−xTixCoSnySb1−y (0.0<x < 0.5; y = 0.15 and 0.3)," J. Appl. Phys. 2008, vol. 103, pp. 063716-063720.
Culp et al., "(Zr,Hf)Co(Sb,Sn) half-Heusler phases as high-temperature (>700° C.) p-type thermoelectric materials," Appl. Phys. Lett. 2008, vol. 93, pp. 022105-022107.
Lee et al., "Electronic structure and thermoelectric properties of Sb-based semiconducting half-Heusler compounds," Phys. Rev. B: Condens. Matter Mater. Phys. 2011, vol. 83, pp. 085204-085214.
X. Yan et al., "Enhanced Thermoelectric Figure of Merit of p-Type Half-Heuslers," Nano Lett. 2011, vol. 11, pp. 556-560.
Chauhan et al., "A synergistic combination of atomic scale structural engineering and panoscopic approach in p-type ZrCoSbbased half-Heusler thermoelectric materials for achieving high ZT," J. Mater. Chem. C 2016, vol. 4, pp. 5766-5778.
E. Rausch et al., "Fine tuning of thermoelectric performance in phaseseparated half-Heusler compounds," J. Mater. Chem. C 2015, vol. 3, pp. 10409-10414.
Young et al., "Thermoelectric properties of pure and doped FeMSb (M = V,Nb)," J. Appl. Phys. 2000, vol. 87, pp. 317-321.
L. Jodin et al., "Effect of substitutions and defects in half-Heusler FeVSb studied by electron transport measurements and KKR-CPA electronic structure calculations," Phys. Rev. B: Condens. Matter Mater. Phys. 2004, vol. 70, pp. 184207-184217.
Y. Stadnyk et al., "Crystal structure, electrical transport properties and electronic structure of the VFe$_{1-x}$Cu$_x$Sb solid solution," J. Alloys Compd. 2005, vol. 402, pp. 30-35.
C. Fu et al., "Band engineering of high performance p-type FeNbSb based half-Heusler thermoelectric materials for figure of merit zT > 1," Energy Environ. Sci. 2015, vol. 8, pp. 216-220.
C. Fu et al.,"Realizing high figure of merit in heavy-band p-type half-Heusler thermoelectric materials," Nat. Commun. 2015, vol. 6, pp. 8144-8150.
R. O. Suzuki et al., "Thermoelectric properties of Fe$_2$TiAl Heusler alloys," J. Alloys Compd. 2004, vol. 377, pp. 38-42.
C. S. Lue et al., "Thermoelectric properties of the semimetallic Heusler compounds Fe$_{2-x}$V$_{1+x}$M (M=Al, Ga)," Phys. Rev. B: Condens. Matter Mater. Phys. 2002, vol. 66, pp. 085121-085125.
M. Mikami et al., "Synthesis and thermoelectric properties of microstructural Heusler Fe$_2$VAl alloy," J. Alloys Compd. 2008, vol. 461, pp. 423-426.
M. Mikami et al., "Thermoelectric properties of tungsten-substituted Heusler Fe$_2$VAl Alloy," J. Appl. Phys. 2012, vol. 111, pp. 093710-093715.
P. Ghosez, "Low-Dimensional Transport and Large Thermoelectric Power Factors in Bulk Semiconductors by Band Engineering of Highly Directional Electronic States," Phys. Rev. Lett. 2015, vol. 114, pp. 136601-136605.
A. Page et al., "A first-principles approach to half-Heusler thermoelectrics: Accelerated prediction and understanding of material properties," J Materiomics (2016), vol. 2, pp. 104-113.
J. Barth et al., "Anomalous transport properties of the half-metallic ferromagnets Co$_2$TiSi, Co$_2$TiGe and Co$_2$TiSn." Phil. Trans. R. Soc., A 2011, vol. 369, pp. 3588-3601.
N. Verma et al., "Microstructure Evolution of Biphasic TiNi$_{1+x}$Sn Thermoelectric Materials," Metall. Mater. Trans. A 2016, vol. 47, pp. 4116-4127.

(56) References Cited

OTHER PUBLICATIONS

K. Kirievsky et al., "Phase separation and antisite defects in the thermoelectric TiNiSn half-Heusler alloys," J. Solid State Chem. 2013, vol. 203, pp. 247-254.

L.-D. Zhao et al., "Raising the Thermoelectric Performance of p-Type PbS with Endotaxial Nanostructuring and Valence-Band Offset Engineering Using CdS and ZnS," J. Am. Chem. Soc. 2012, vol. 134, pp. 16327-16336.

L.-D. Zhao, et al., "High Thermoelectric Performance via Hierarchical Compositionally Alloyed Nanostructures," J. Am. Chem. Soc. May 15, 2013, vol. 135, No. 19, pp. 7364-7370.

D. I. Bilc et al., "Low-Dimensional Transport and Large Thermoelectric Power Factors in Bulk Semiconductors by Band Engineering of Highly Directional Electronic States," Phys. Rev. Lett. vol. 114, pp. 136601-136605 (2015).

J. Carrete et al., "Nanograined Half-Heusler Semiconductors as Advanced Thermoelectrics: An Ab Initio High-Throughput Statistical Study," Adv. Funct. Mater. vol. 24, pp. 7427-7432 (2014).

* cited by examiner

US 11,302,855 B2

HIGH-EFFICIENCY TWO-PHASE HEUSLER THERMOELECTRIC MATERIALS

CROSS-REFERENCE TO RELATED APPLICATIONS

The present application claims priority to U.S. Provisional Patent Application No. 62/642,144 that was filed Mar. 13, 2018, the entire contents of which are hereby incorporated by reference.

REFERENCE TO GOVERNMENT RIGHTS

This invention was made with government support under N66001-15-C-4036 awarded by the Defense Advanced Research Projects Agency. The government has certain rights in the invention.

BACKGROUND

Thermoelectric devices are environmentally-friendly energy converters having the advantage of a small size, high reliability, non-polluting, and feasibility over a wide temperature range. A thermoelectric device generally includes p- and n-type semiconductors, placed between insulating plates. By introducing a thermal gradient on either side of the device, a voltage is created via the thermoelectric effect, causing electricity to flow through an external circuit. The thermoelectric effect is the direct conversion of a thermal gradient to an electric voltage, which on the atomic scale causes charge carriers in the thermoelectric material to diffuse from the hot side to the cold side, producing the electrical current. The efficiency of a thermoelectric device is predominantly determined by the properties of the p- and n-type semiconducting materials, i.e., the thermoelectric materials. High performance thermoelectric materials that can directly and reversibly convert heat to electrical energy are desirable.

SUMMARY

Provided herein are thermoelectric materials and devices comprising the thermoelectric materials.

Thermoelectric materials are provided. In embodiments, such a material is composed of an isostructural pair of Heusler compounds, either a pair of full Heusler (FH) $X_2YZ$ compounds or a pair of half Heusler (HH) XYZ compounds. In the FH pair, a first compound of the pair has the formula $(X1)_2Y1Z1$, wherein X1 is selected from Fe and Co; Y1 is selected from Ti, V, Nb, Hf, and Ta; and Z1 is selected from Al, Ga, Si, and Sn and a second compound of the pair has the formula $(X2)_2Y2Z2$, wherein X2 is selected from Mn, Fe, Co, Ru, and Rh; Y2 is selected from Ti, V, Mn, Zr, Nb, Hf, and Ta; and Z2 is selected from Be, Al, Ga, Si, Ge and Sn. The first and second compounds of the pair share two elements in common and have third elements which are different and are either isovalent or have a valency which differs by ±1.

In the HH pair, a first compound of the pair has the formula X1Y1Z1 wherein X1 is selected from Ni and Fe; Y1 is selected from Ti, V, and Nb; and Z1 is selected from Sn and Sb and a second compound of the pair has the formula X2Y2Z2 wherein X2 is selected from Fe, Ru and Pt; Y2 is selected from Ti, V, and Nb; and Z2 is selected from Sn and Sb. The first and second compounds of the pair share two elements in common and have third elements which are different and are either isovalent or have a valency which differs by ±1.

The thermoelectric material at room temperature has a nanostructured two-phase form having a matrix phase composed of the first compound of the FH pair or the first compound of the HH pair and a nanostructured phase composed of the second compound of the FH pair or the second compound of the HH pair, respectively.

Thermoelectric devices comprising the thermoelectric materials are also provided.

Other principal features and advantages of the present disclosure will become apparent to those skilled in the art upon review of the following drawings, the detailed description, and the appended claims.

BRIEF DESCRIPTION OF THE DRAWINGS

Illustrative embodiments of the present disclosure will hereafter be described with reference to the accompanying drawings.

DETAILED DESCRIPTION

Provided herein are thermoelectric materials and devices comprising the thermoelectric materials. At least some embodiments of the thermoelectric materials are cheaper and more efficient than conventional thermoelectric materials.

Figure 1:
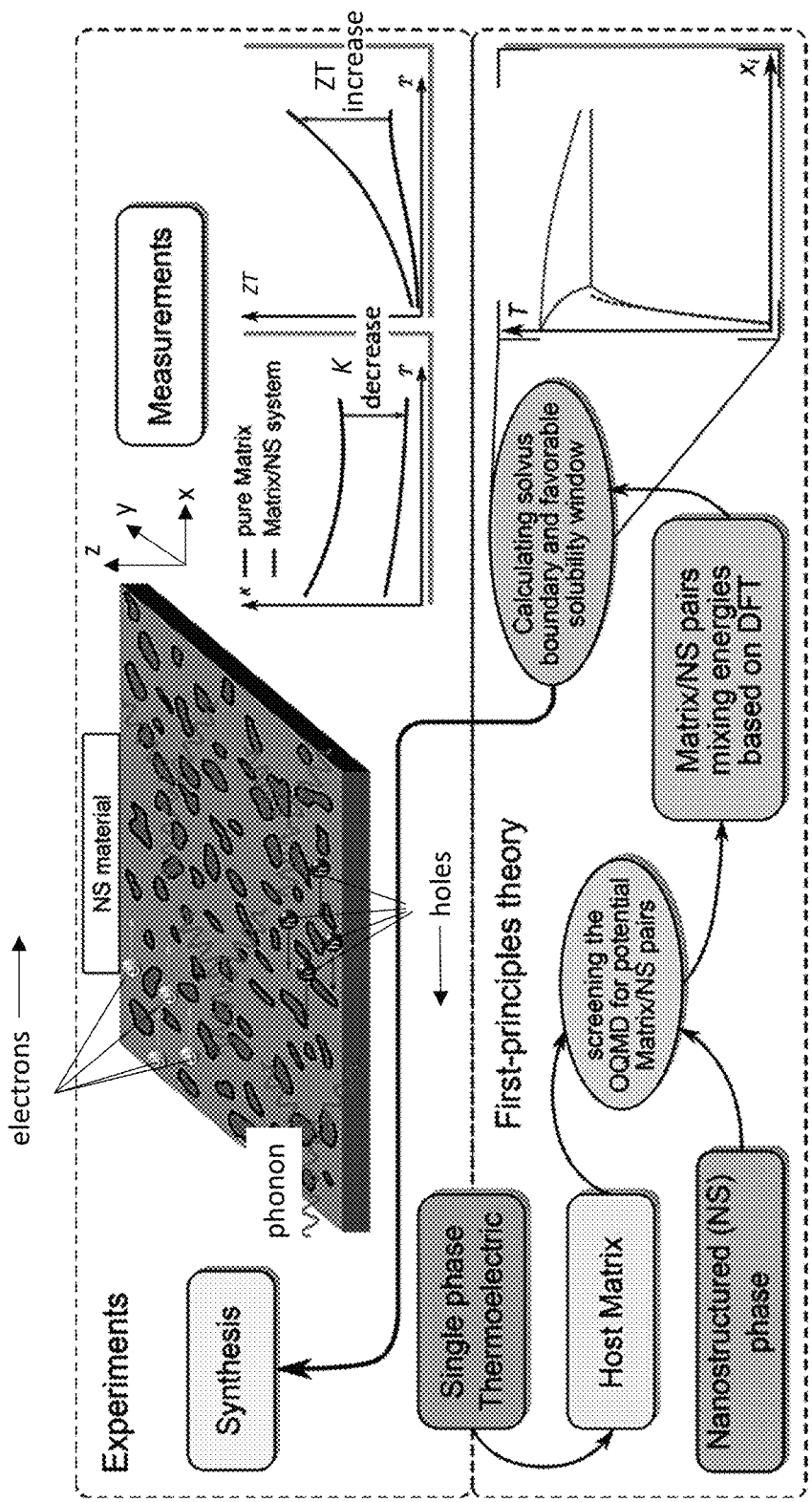
FIG. 1 shows a schematic representation of the screening strategy used in this disclosure and the increased thermoelectric figure of merit (ZT) in nanostructured (NS) Heusler materials. The top panel shows a schematic of NS materials and measured quantities (top right) for such materials (decreased κ, increased ZT) (κ is thermal conductivity). The bottom panel represents the usage of first-principles high-throughput screening in discovering improved thermoelectrics. Single phase materials with favorable thermoelectric properties were chosen as potential host matrices (bottom left). Possible matrix/NS phase pairs were then screened to evaluate which pairs can form stable, two-phase NS material (bottom middle). Then, mixing energies were calculated to estimate the solubility of the NS phase in the host matrix using a fit of the solvus (see "Mixing Energy Intervals" in the Example below). The screening for potential matrix/NS phase pairs is detailed in "Host Matrices and Nanostructured Phase Screening" in the Example below.

In one aspect, a thermoelectric material is provided. In embodiments, a thermoelectric material is composed of an isostructural pair of Heusler compounds. By "isostructural," it is meant that the two compounds of the pair have the same crystal structure, (e.g., a pair of full Heusler (FH) compounds or a pair of half Heusler (HH) compounds), but not the same chemical formula. The thermoelectric material may be in the form of a nanostructured two-phase material wherein one phase, referred to as the matrix phase, is composed of one of the Heusler compounds of the pair. In the nanostructured two-phase material, the other phase, referred to as the nanostructured phase, is composed of the other of the Heusler compounds of the pair. The nanostructured phase is generally in the form of a plurality of nanoscale islands dispersed throughout the matrix phase. (See FIG. 5B.) In general, the nanoscale islands have at least one dimension which is nanoscale, i.e., no greater than about 1000 nm. As shown in FIG. 1, they may be characterized by a dimension as measured along the x axis which is nanoscale, a dimension as measured along the y axis which is nanoscale, a dimension as measured along the z axis which is nanoscale, some combination thereof, or all three. Whether the thermoelectric material adopts the nanostructured two-phase form depends upon the selection of the two Heusler compounds, their relative amounts, and the temperature of the material.

In the present disclosure, the two Heusler compounds of the isostructural pair are selected such that the thermoelectric material can adopt a nanostructured two-phase form at a desired temperature and at desired relative amounts of the two compounds. In embodiments, the selected two compounds are in the nanostructured two-phase form at room temperature (295 K-300K) and at an elevated temperature (e.g., 500 K, 600 K, 700 K, 800 K, 900 K, 1000 K, 1100 K, 1200 K, or 1300 K). In embodiments, the selected two compounds are in the nanostructured two-phase form over a range of temperatures, e.g., from room temperature to below the lowest melting temperature of the two compounds. In embodiments, the range of temperatures is from room temperature to 1300 K, from room temperature to 1200 K, from room temperature to 1100 K, from room temperature to 1000 K, from room temperature to 900 K, from room temperature to 800 K, from room temperature to 700 K, from room temperature to 600 K, or from room temperature to 500 K. In these ranges, above the melting temperature of the matrix phase, the morphology of the thermoelectric material changes to a solution as the nanostructured phase dissolves into the molten matrix phase.

Regarding the relative amounts, in order to form the nanostructured two-phase morphology, generally one of the compounds of the pair is present at a much greater amount than the other. The first compound of the pair may be characterized as the compound which forms the matrix phase in the thermoelectric material while the second compound of the pair may be characterized as the compound which forms the nanostructured phase. Thus, the first compound will generally be present at a much greater amount than the other second compound of the pair. In embodiments, the amount of the second compound (the nanostructured phase) is present at an amount up to 12%. This includes embodiments in which the amount is in a range of from 1% to 12%, from 2% to 10%, or from 4% to 8% (the rest of the thermoelectric material being made up of the first compound).

Suitable Heusler compounds used to form the matrix phase include full Heusler compounds and half Heusler compounds which have desirable thermoelectric properties and are thermodynamically stable. The thermodynamic stability can be calculated as described in the Example, below. Full Heusler compounds are of the $Fm\bar{3}m$ (225) space group and have the formula $X_2YZ$, wherein X and Y are different transition metals and Z is a main group element. Half Heusler compounds are of the $F\bar{4}3m$ (216) space group and have the formula XYZ, wherein X and Y are different transition metals and Z is a main group element.

Illustrative compounds for the first compound include full Heusler compounds having the formula $X_2YZ$, wherein X is selected from Fe and Co; Y is selected from Ti, V, Nb, Hf, and Ta; and Z is selected from Al, Ga, Si, and Sn. In embodiments, if X is Co, then Y is Ti; and Z is Sn. In embodiments, if X is Fe, then Y is selected from V, Nb, Hf, and Ta; and Z is selected from Al, Ga, Si, and Sn.

Illustrative compounds for the first compound also include half Heusler compounds having the formula XYZ, wherein X is selected from Ni and Fe; Y is selected from Ti, V, and Nb; and Z is selected from Sn and Sb. In embodiments, if X is Ni, then Y is Ti and Z is Sn. In embodiments if X is Fe, then Y is V or Nb; and Z is Sb.

Specific illustrative compounds for the first compound are listed in Table 6 of the Example, below (identified as "matrix").

As noted above, the second compound of the isostructural pair may be characterized as the compound which forms the nanostructured phase in the thermoelectric material. Suitable Heusler compounds used to form the nanostructured phase include full Heusler compounds and half Heusler compounds which have one or more or all of the following properties: thermodynamic stability (which may be calculated as noted above); capability of forming a two-phase equilibrium with the selected first compound (which may be calculated as described in the Example, below); two elements in common with the selected first compound and a third different element; relatively small lattice mismatch with the selected first compound (e.g., no more than 5%, no more than 4%, no more than 3%, no more than 2%); and a mixing energy with the selected first compound which is within a predetermined interval of mixing energies. This predetermined interval of mixing energies (NSing energy interval) as well as the mixing energy for an isostructural pair ($\Delta E_{mix}$) may be calculated as described in the Example, below. Finally, in embodiments, none of the elements of the second compound are selected from lanthanide or actinide elements.

Illustrative compounds for the second compound include full Heusler compounds having the formula $X_2YZ$, wherein X is selected from Mn, Fe, Co, Ru, and Rh; Y is selected from Ti, V, Mn, Zr, Nb, Hf, and Ta; and Z is selected from Be, Al, Ga, Si, Ge and Sn. In embodiments, if X is Co, then Y is selected from Ti, Mn, Zr, Nb, Hf, and Ta; and Z is selected from Al, Ga, and Sn. In embodiments, if X is Fe, then Y is selected from Ti, V, Mn, Nb, Hf, and Ta; and Z is selected from Be, Al, Ga, Ge, and Sn. In embodiments, if X is Ru, then Y is selected from Ti and Hf; and Z is selected from Al and Sn. In embodiments, if X is Mn, then Y is Ti; and Z is Si. In embodiments, if X is Rh, then Y is Ti; and Z is Sn.

Illustrative compounds for the second compound also include half Heusler compounds having the formula XYZ, wherein X is selected from Fe, Ru and Pt; Y is selected from Ti, V, and Nb; and Z is selected from Sn and Sb. In embodiments if X is Fe, then Y is V or Nb; and Z is Sb. In embodiments, if X is Ru, then Y is Nb; and Z is Sb. In embodiments, if X is Pt, then Y is Ti; and Z is Sn.

Specific illustrative compounds for the second compound are listed in Table 6 in the Example, below (identified as "NS comp.").

In addition to the selection criteria described above for the first and second compounds of the isostructural pair, the following criterion may also apply: the non-shared elements between the pair of compounds may be isovalent or have a difference in valency of ±1.

Specific, illustrative isostructural pairs of Heusler compounds which may be used to provide the present thermoelectric materials are provided in Table 6 of the Example, below. A pair may be referenced as first compound/second compound, e.g., FeVSb/FeNbSb.

In embodiments, the following pairs of Heusler compounds are excluded from the present disclosure: Ni(Ti,Zr, Hf)Sn/Ni$_2$(Ti,Zr,Hf)Sn; NiTiSn/NiZrSn; Co(Ti, Zr, Hf)Sb/Ni$_2$(Ti,Zr,Hf)Sn, FeNbSb/FeVSb, NiTiSn/PtTiSn.

The present thermoelectric materials may be formed by mixing the selected isostructural pairs of Heusler compounds. Known methods may be used to form the Heusler compounds themselves. Known techniques may be used to confirm that the thermoelectric material has the nanostructure two-phase form at a selected temperature, e.g., room temperature.

Figure 8:
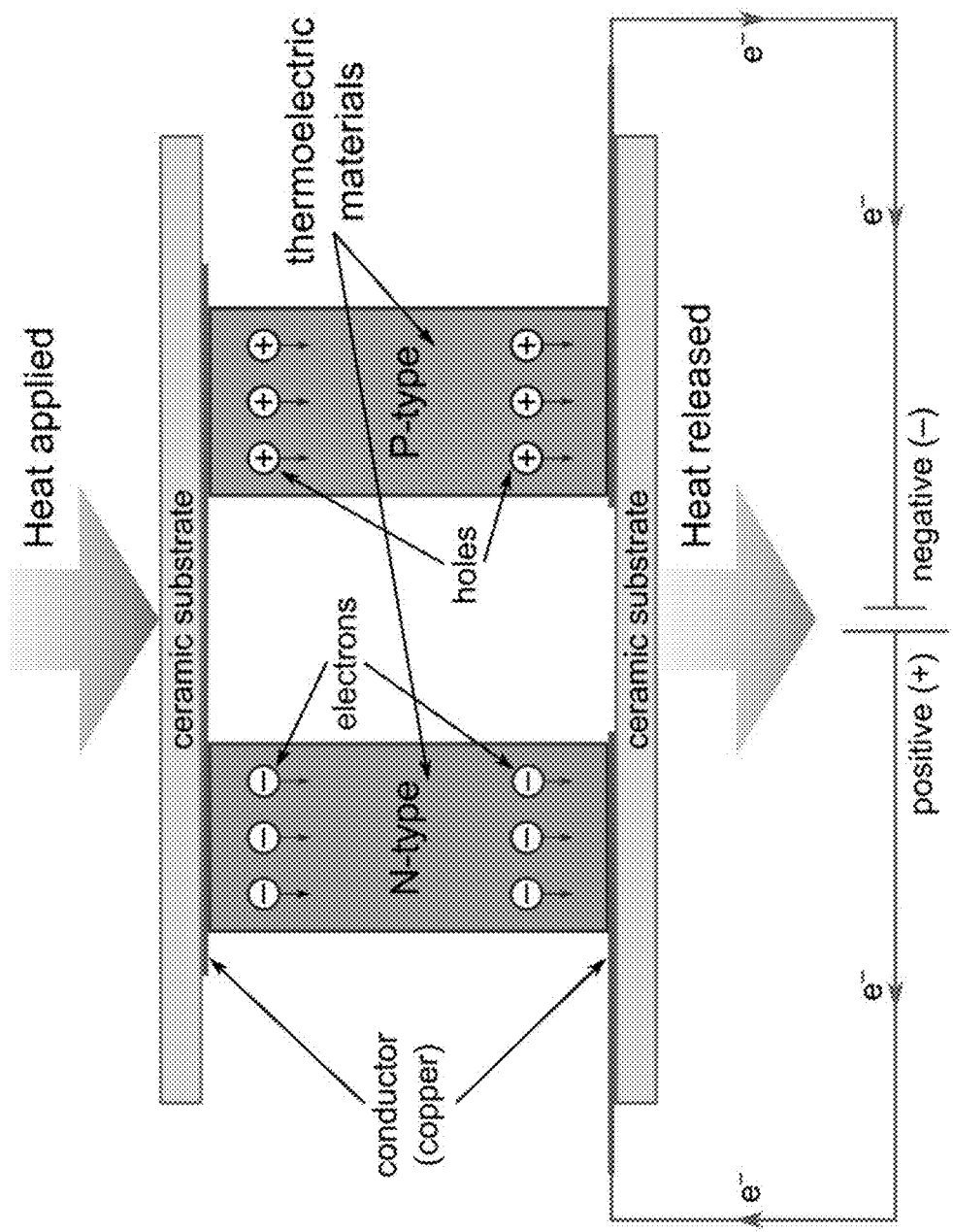
FIG. 8 shows a schematic of a thermoelectric device comprising the present thermoelectric materials according to an illustrative embodiment.

The present thermoelectric materials will find use in a variety of thermoelectric devices, including the devices described in the Background, above. An illustrative thermoelectric device is shown in FIG. 8. The figure indicates where the present thermoelectric materials may be used in the device.

Applications for the present thermoelectric materials and devices include, but are not limited to, the following: power sources in satellites and space probes; harvesting waste heat from power plants, vehicles, industrial process, and consumer appliances so as to produce additional electricity; low-voltage power sources for portable applications (e.g., wrist watches); and cooling of electronics, vehicles and refrigeration.

EXAMPLE

Introduction

Utilizing the thermoelectric effect to scavenge waste heat into usable electricity has been of great interest for global energy sustainability. Thermoelectric materials could, in principle, be used in power generation from industrial processes, home heating, automotive exhaust, and other heat generating sources, with materials that have large conversion efficiency being of great importance. However, identifying and developing novel thermoelectric materials with high conversion efficiency faces many challenges mainly due to the difficulties in independent manipulation of their properties. The efficiency of thermoelectric materials is determined by the thermoelectric figure of merit, ZT, defined as:

$$ZT = \frac{\sigma S^2}{\kappa} T \qquad (1)$$

where S is the Seebeck coefficient, σ is the electrical conductivity, T is the thermodynamic temperature, and κ is the thermal conductivity of the material (the sum of the electrical ($\kappa_{el}$) and lattice ($\kappa_{lat}$) thermal conductivity). ZT be increased by decreasing the denominator in Eq.1, κ, and/or by increasing the numerator, $\sigma S^2$, known as the thermoelectric power factor (PF) of a material (PF=$\sigma S^2$). Unfortunately, the S, σ and $\kappa_{el}$ are strongly correlated with the electronic structure of the material, and they often cannot be independently optimized.

This Example presents a DFT based screening strategy to determine Heusler thermoelectric compounds that can form two-phase NS materials with other Heusler compounds. The main goal was to utilize the predictive power of the DFT to determine suitable combination of matrix and nanostructured phase, termed matrix/NS pairs, that can be synthesized as two-phase NS materials, and hence should possess improved thermoelectric properties. The main objective is schematically outlined in FIG. 1. Two-phase systems were considered, involving the ~105 full, half, and inverse Heusler compounds in the Open Quantum Materials Database (OQMD), in total a search space of ~1011 possible combination of two Heusler compounds. (Saal, J. E. et al., JOM 2013, 65, 1501-1509; Kirklin, S. et al., npj Comput. Mater. 2015, 1, 15010-15025, Article.) This space was significantly reduced by starting from host matrices which are known to possess favorable thermoelectric properties and screened for all second phase systems that are stable and form a two-phase equilibrium with the matrix. This gave ~104 possible pairs, which were reduced further to ~102 pairs by considering systems with mixing of only one element and eliminating radioactive/actinide elements. Using this screening approach, 106 matrix/NS phase pairs were found.

DFT was used to investigate the mixing energy of the matrix/NS phase pairs, and the solvus boundary between the matrix and the NS phase was estimated, from which a mixing energy interval was determined in which formation of two-phase NS materials was favorable. 31 pairs with mixing energy within the energy interval that promotes formation of two-phase NS materials were found. Several of the 29 matrix/NS pairs are interesting for NS thermoelectrics due to the large mass difference between the mixing atoms (e.g. $Fe_2TiSn/Fe_2HfSn$ pair) or because the mixing atom serves as dopant (e.g. $Fe_2TiSi/Mn_2TiSi$ pair).

Methodology

Figure 2B:
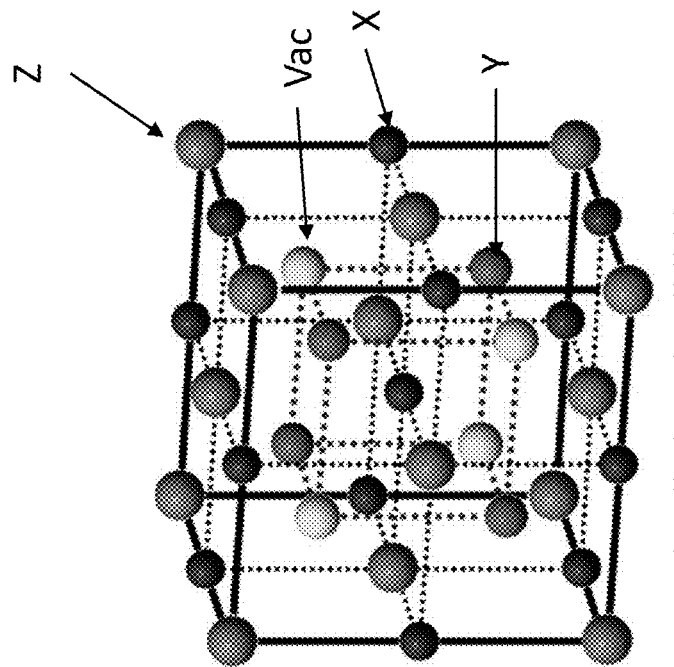
FIGS. 2A-2B show crystal structure of: full Heusler (FIG. 2A); and half Heusler (FIG. 2B), with the X, Y, Z, and vacancy sublattices shown.
Figure 2A:
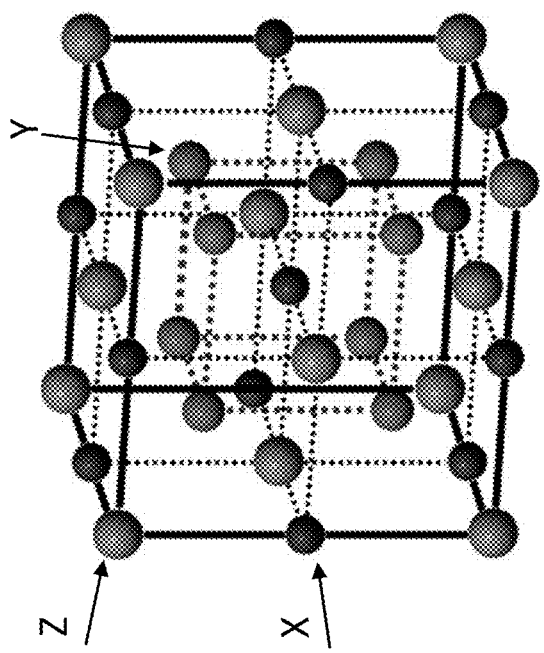

The FH compounds have the Heusler structure with a general formula $X_2YZ$, where X and Y are transition metals and Z is a main group element. The structure has the $Fm\bar{3}m$ (225) space group, with the Y and Z atoms forming a NaCl structure, and the X atoms are in the tetrahedral sites of the YZ NaCl-like structure (see FIG. 2A). The X atoms can also be regarded as forming two different face-centered cubic (fcc) sublattices, X1 and X2. The Y atom is located at (0, 0, 0), the Z atom at (½, ½, ½), and the X1 and X2 atoms at (¼, ¼, ¼) and (¾, ¾, ¾), respectively. The HH structure is closely related to the Heusler structure, where the X2 sublattice is empty, as shown in FIG. 2B. The space group of the HH structure is $F\bar{4}3m$ (216) and can be viewed as made of 4 distinct fcc sublattices, as shown in FIG. 2B.

For each of the matrix/NS phase pairs the mixing energies were calculated, as detailed below. The calculations were performed using the Perdew-Burke-Ernzerhof (PBE) generalized-gradient approximation, employing the projector augmented plane wave (PAW) method, as implemented in VASP (Vienna Ab-initio Simulation Package). (Perdew, J. P. et al., *Phys. Rev. Lett.* 1997, 78, 1396-1396; Blöchl, P. E., *Phys. Rev. B* 1994, 50, 17953-17979; Kresse, G. et al., *Phys. Rev. B* 1999, 59, 1758-1775; Kresse, G. et al., *Phys. Rev. B* 1996, 54, 11169-11186.) The OQMD scheme was used for performing VASP GGA-PBE calculation: 520 eV energy cutoff, 10-4 eV energy convergence criterion, and using spin polarization. Equivalent basis set size and other integration grids were used for each of the different sizes of supercells, and a k-mesh (Monkhorst-Pack) with KPPRA (k-point density per reciprocal atom) of 8000 was used. Every crystal structure, pure and alloyed, was fully relaxed, i.e., cell volume, cell shape, and ionic positions. Note that the calculated energies are at zero temperature and pressure. In addition, for better estimate of the solubility between the two compounds the vibrational entropy of mixing (see "Mixing Energy Intervals") was also calculated, for which the phonon dispersion is required. The phonon dispersion was calculated using finite displacement method in 2×2×2 supercells with the Phonopy code. (Togo, A. et al, *Phys. Rev. B* 2008, 78, 134106-134114.)

Figure 3:
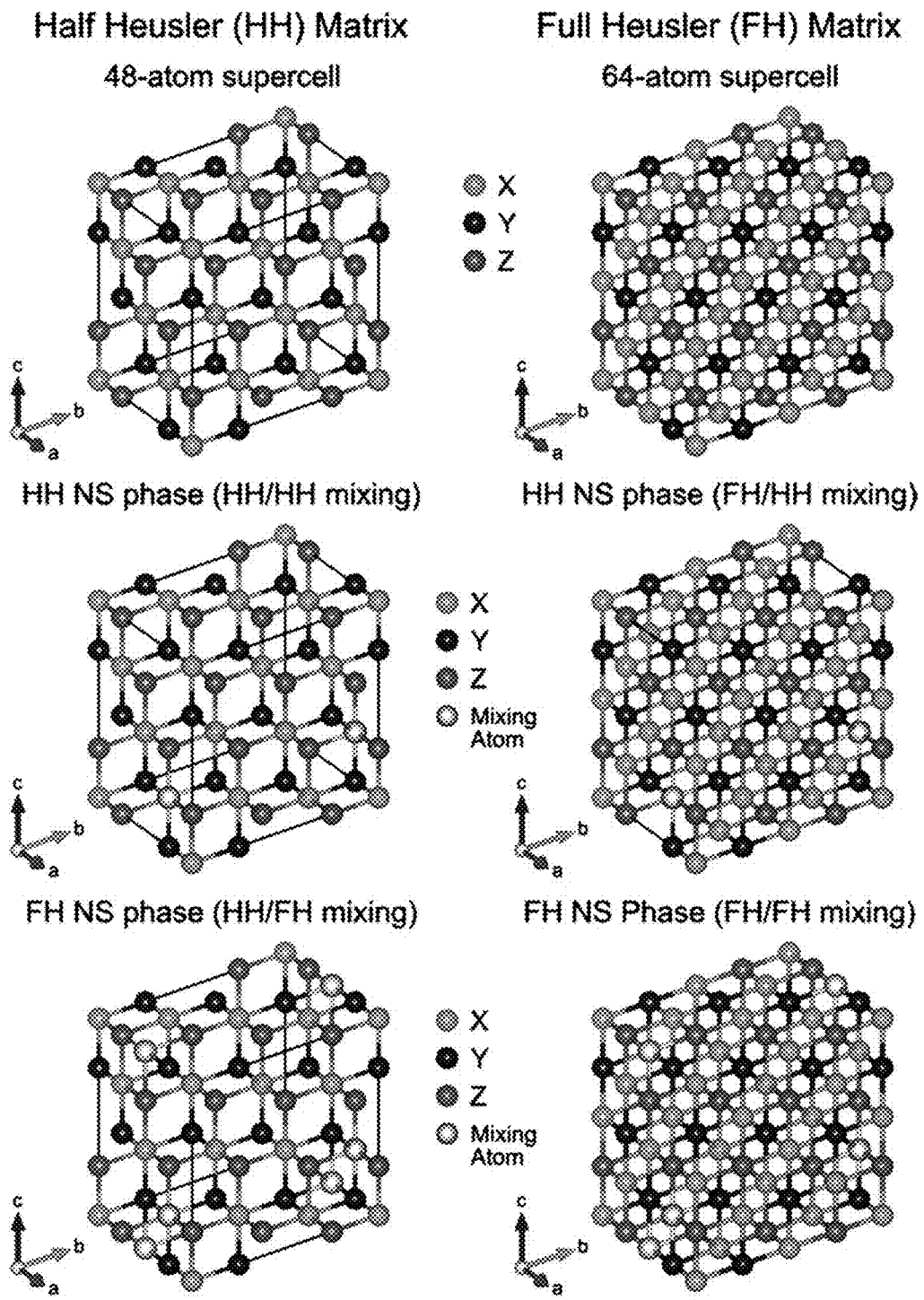
FIG. 3 shows in the left panel a half Heusler matrix 48-atom supercell (top left), mixed on X site with other HH (middle left) and FH (bottom left). The right panel shows a full Heusler matrix 64-atom supercell (top right), mixed on X site with HH (middle right) and other FH (bottom right). The mixing atoms are shown in gray, and the X, Y, and Z atoms are indicated.

The mixing of the host matrix with the NS phase is done such that the stoichiometry of the mixed system always lies on the tie-line between the two constituent compounds. A tie-line connecting two phases implies a stable two-phase equilibrium exists between those phases. This Example generally looked for the existence of a tie-line on the T=0 K convex hull to determine stable two-phase equilibria. Mixing on the Y or Z site was performed by respectively substituting one of the Y or Z atoms with the mixing atom. However, keeping in mind the difference in number of atoms on the X site in HH and FH compounds and the possibility of mixing between HH and FH, mixing on the X site requires explanation. The case of HH/HH mixing (or FH/FH) mixing is simpler, where one (or two) X atoms are substituted by the mixing atom. On the other hand, in the case of HH matrix and FH NS phase (HH/FH mixing), one atom on X1 site is substituted by the mixing atom and another mixing atom is placed in the neighboring X2 (vacant) site, thus keeping the stoichiometry of the system still on the tie-line between the two compounds. Similarly, in the case of FH matrix and HH NS phase (FH/HH mixing), the X1 atoms is substituted by the mixing atom, and a neighboring X2 atom is removed leaving a vacancy, as this sublattice is vacant in the HH structure. For clearer picture of the mixing on the X site, FIG. 3 shows an atomistic representation of the supercells depicting the mixing between different types of Heusler compounds.

Having in mind the large number of calculations that need to be performed, identifying the smallest possible supercell that can produce reliable results is important. Therefore, 5 different sizes of supercells were considered; for the case of HH structure there are: 12-atoms (conventional cell), 24-atoms (2×2×2 of the primitive cell), 48-atoms (rhombohedral bcc-style cell), 81-atoms (3×3×3 of the primitive cell), and 96-atoms (2×2×2 of the conventional cell). For the purpose of the supercell size evaluation, the mixing energies of the NiTiSn host matrix were examined, as the most studied system experimentally, with 4 other compounds: NiZrSn, NiTiSb, $Ni_2TiSn$, and $Co_2TiSn$, as well as the mixing energy of the NiZrSn matrix with NiTiSn. The mixing energies, $\Delta E_{mix}^{XY(A)Z}$, between two Heusler phases, in this example two HH compounds, XYZ and XAZ, are calculated within the dilute limit using $$\Delta E_{mix}^{XY(A)Z} = E_{tot}^{XY(A)Z} - \frac{N_Y - 1}{N_Y}\Delta E_{tot}^{XYZ} - \frac{1}{N_Y}E_{tot}^{XAZ} \quad (2)$$

where $E_{tot}^{XY(A)Z}$ is the DFT total energy of a supercell of XYZ with 1 mixing atom, and $N_Y$ is the number of atoms in a particular sublattice (in this case the Y sublattice). $E_{tot}^{XYZ}$ and $E_{tot}^{XAZ}$ are the DFT total energies of the supercells of pure XYZ and XAZ, respectively. The calculated mixing energies of the matrix/NS phase pairs using different supercell sizes are summarized in Table 1.

TABLE 1

Mixing energies (in eV) between half Heusler matrices and different Heusler compounds as NS phase, as a function of the supercell size.

| System (mixing atom) | Supercell size | | | | |
|---|---|---|---|---|---|
| | 12-atoms | 24-atoms | 48-atoms | 81-atoms | 96-atoms |
| NiTi(Zr)Sn | 0.16 | 0.15 | 0.15 | 0.15 | 0.16 |
| NiZr(Ti)Sn | 0.15 | 0.14 | 0.14 | 0.14 | 0.14 |
| NiTiSn(Sb) | −0.17 | −0.23 | −0.27 | −0.29 | −0.29 |
| Ni($Ni_2$)TiSn | 0.37 | 0.40 | 0.39 | 0.39 | 0.39 |
| Ni($Co_2$)TiSn | 0.44 | 0.33 | 0.34 | 0.33 | 0.32 |

For each of the studied systems, the changes of the mixing energy when using 81-atom or 48-atom supercell is very small (<5%) compared to the mixing energy for 96-atom supercell. In the case of the 24-atom supercell, except for the NiTiSn/NiTiSb system that exhibits significant change in the mixing energy (~20%), the mixing energies for all other systems show small difference with respect to the largest supercell. Further decreasing of the supercell size influences only the mixing energy in the NiTiSn/NiTiSb and NiTiSn/$Co_2TiSb$ systems. The other 3 studied systems show that even at the smallest supercell, 12 atoms, the mixing energies converged, and the mixing energies change insignificantly compared to the largest supercell. This demonstrates that although using the 24-atom supercell can yield good results in some cases, the 48-atom supercell would give reliable results in most of the cases. Therefore, for the rest of the Example, the 48-atom supercell was used.

Results and Discussion
Host Matrices and Nanostructured Phase Screening

This Example makes use of the OQMD. (Saal, J. E. et al., 2013; Kirklin, S. et al., 2015.) As of October 2016, the OQMD contained ~265,000 FH, HH and IH compounds. Exploring every possible combination of two-phase matrix/NS pair would entail a space of $(265,000)^2 \sim 10^{11}$ possible systems. This is an impractically large space of possible systems, and hence, the search space was significantly narrowed. Starting with the host matrices, to narrow the composition space the following HH compounds were considered: NiM1 Sn and CoM1 Sb (M1=Ti, Zr, Hf) and FeM2 Sb (M2=V, Nb). As FH host matrices, the following compounds were considered: $Fe_2M1Sn$ and $Fe_2M1Si$ (M1=Ti, Zr, Hf); and $Fe_2TiAl$ and $Co_2TiSn$. See Table 2 for the full list of host matrices. In addition, because stable, two-phase mixtures were screened for, the host matrices needed to be thermodynamically stable, i.e., to be on the convex hull according to the OQMD. After introducing the latter criteria, 5 HH and 9 FH stable matrices were left, the ones specified with S in Table 2.

As mentioned in the previous section, the main goal is to find compounds that can form NS within the host matrices. Therefore, it is crucial to find compounds that can form a two-phase equilibrium, where both the matrix and NS phase are stable, i.e., compounds that have convex hull tie-lines with the host matrices. From the initial screen for possible tie-lines between the considered host matrices and any Heusler compound (half, inverse Heusler, and full Heusler) in the OQMD, 15,350 possible matrix/NS phase pairs were obtained. Considering the 14 host matrices, this means that, on average, each one of the host matrices has ~1000 tie-lines to other Heusler phases in the OQMD. This is a substantial number of pairs, and by screening out the NS phases that have 2 common elements with the host matrices, 189 pairs were left. The compounds having actinides and lanthanides were further screened out, arriving at 138 pairs.

TABLE 2

List of considered host matrices. Y and N indicate whether the compounds were previously experimentally and/or theoretically studied or not, respectively. The OQMD column shows whether the compound is stable (S) or unstable (U) in the OQMD (using the data set as of October 2016), where in parenthesis are shown the distance from the convex hull of the unstable compounds.

| half Heusler matrices | | | full Heusler matrices | | | |
| --- | --- | --- | --- | --- | --- | --- |
| Comp. | Expr. | OQMD | Comp. | Expr. | Theory | OQMD |
| NiTiSn | Y | S | $Fe_2TiSi$ | N | Y | S |
| NiZrSn | Y | S | $Fe_2ZrSi$ | N | Y | U (0.129 eV) |
| NiHfSn | Y | U(0.640 eV) | $Fe_2HfSi$ | N | Y | U (0.064 eV) |
| CoTiSb | Y | S | $Fe_2TiSn$ | N | Y | S |
| CoZrSb | Y | U (0.887 eV) | $Fe_2ZrSn$ | N | Y | U (0.048 eV) |
| CoHfSb | Y | U (0.925 eV) | $Fe_2HfSn$ | N | Y | S |
| FeVSb | Y | S | $Fe_2VAl$ | Y | Y | S |
| FeNbSb | Y | S | $Fe_2NbAl$ | N | Y | S |
| | | | $Fe_2TaAl$ | N | Y | S |
| | | | $Fe_2VGa$ | N | Y | U (0.054 eV) |
| | | | $Fe_2NbGa$ | N | Y | U (0.076 eV) |
| | | | $Fe_2TaGa$ | N | Y | S |
| | | | $Fe_2TiAl$ | Y | | S |
| | | | $Co_2TiSn$ | Y | | S |

Figure 4:
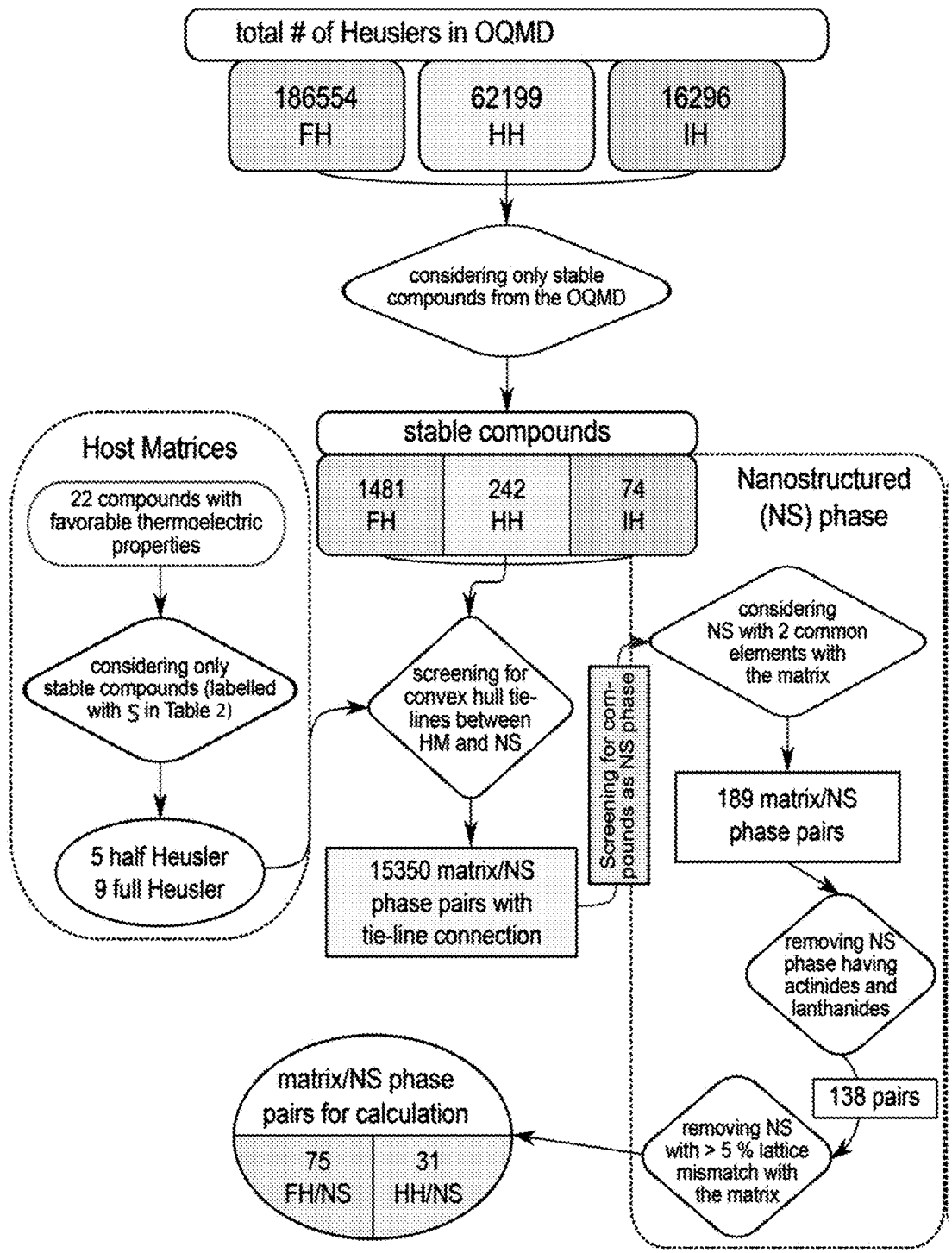
FIG. 4 shows a schematic representation of the screening strategy for two-phase Heusler based nanostructured (NS) materials, starting from the total number of full Heusler (FH), half Heusler (HH), and inverse Heusler (IH) in the Open Quantum Materials Database (OQMD). The left side represents the set of considered host matrices, and the right side depicts the screening process for the NS phase. The bottom central part shows the total number of FH/NS and HH/NS phase pairs considered.

Keeping in mind the high PF of the Heusler compounds, the aim was to find matrix/NS phase pairs that can form a coherent interface that might facilitate electron transport without much scattering and hence have an insignificant influence on the PF. It is thought that although the influence of the coherent interface on the lattice thermal conductivity is smaller compared to the influence of the incoherent interface, the coherent interface has a greater influence on the increasing ZT of NS thermoelectrics. A coherent interface typically requires a relatively small lattice mismatch between the matrix and NS phase. Therefore, the NS phases that have a lattice parameter more than 5% different from that of the host matrix were screened out. Doing this reduced the data set to 31 unique HH/NS phase pairs and 75 unique FH/NS phase pairs. For better overview, the whole screening process is schematically represented in FIG. 4, where the total number of FH, HH, and inverse Heusler (IH) in the OQMD are listed at the top. Note that after applying the screening criterion, no matrix/NS pairs with IH as a nanostructured phase were found (see FIG. 4); thus, below, only HH and FH compounds will be discussed as nanostructured phase.

Alloying of Heusler Compounds

To facilitate the calculations of the mixing energies for the whole set of matrix/NS phase pairs, various alloying sites and different numbers of alloying elements were considered to verify that the method of mixing the host matrix and NS phase gives the lowest mixing energy. NiTiSn was taken as an illustrative host matrix, and the matrix was alloyed with one atom, taking Sb and Zr as alloying atoms, which corresponds to HH/HH mixing. In addition, due to interest in the mixing between HH and FH compounds, NiTiSn was alloyed with the following: two Fe atoms, corresponding to $NiTiSn/Fe_2TiSn$ (HH/FH) mixing, and one Ni atom that corresponds to $NiTiSn/Ni_2TiSn$ (another type of HH/FH mixing). The defect formation energy of an element A, $\Delta E_f^A$, is calculated using the equation:

$$\Delta E_f^A = E^A - E^0 - \Sigma_{i=1}^N \Delta n_i (\mu_i^0 + \Delta \mu_i) \quad (3)$$

where $E^A$ and $E^0$ are the DFT total energies of a supercell with and without the alloying element, respectively. The summation is done over all (N) atomic species i in the supercell (e.g. X, Y, Z, and A). $\Delta n_i$ is the change in the number of atom type i in the supercell, where $\Delta n_i > 0$ and $\Delta n_i < 0$ show that the atom is being added and removed, respectively. $\mu_i^0$ and $\Delta \mu_i$ are the chemical potential of the atomic species i in their elemental state (DFT ground state crystal structure) and the change in the chemical potential relative to $\mu_i^0$ as a result of the N-phase equilibrium, respectively.

The N-phase equilibrium is obtained from the OQMD by calculating the stable phases in equilibrium at the particular composition. For example, alloying TiNiSn with Sb can be done on Ti, Ni, Sn, or a vacancy site, yielding four different compositions, $Ti_{15}Ni_{16}Sn_{16}Sb$, $Ti_{16}Ni_{15}Sn_{16}Sb$, $Ti_{16}Ni_{16}Sn_{15}Sb$, and $Ti_{16}Ni_{16}Sn_{16}Sb$, respectively. To obtain the 4-phase equilibrium, for each of the four compositions the phases in equilibrium were calculated according to the OQMD. For example, in the case of $Ti_{16}Ni_{16}Sn_{16}Sb$, those four phases are TiNiSn, $TiSb_2$, NiSb and $Ni_3Sn_4$. After the N-phase equilibrium has been defined, the set of chemical potentials, $\Delta \mu_i$, can be calculated solving the system of linear equations:

$$\Delta E_k = \Sigma_{i=1}^N c_{ik} \Delta \mu_i \quad (4)$$

where $\Delta E_k$ is the formation energy of phase k (k=1, ..., N), taken from the OQMD, and $c_{ik}$ is the composition of element i in phase k.

In the case of a single alloying element, the NiTiSn 48-atom supercell was alloyed separately on each of the four sublattices: vacancy (Vac), Ti, Ni, or Sn (see FIGS. 2A-2B for more detail on the different sublattices), with one Sb, one Zr, or one Ni atom. The calculations show that Sb alloying on the Sn site (NiTiSn/NiTiSb mixing) and Zr alloying on the Ti site (NiTiSn/NiZrSn mixing) have the lowest defect formation energies: −0.27 eV and 0.13 eV, respectively. On the other hand, the defect formation energies for any of the other three sites are larger than 1.0 eV. In the case of Ni alloying, the configuration with a Ni on a vacancy site, corresponding to the tie-line between NiTiSn and $Ni_2TiSn$, has a defect formation energy of 0.23 eV, which is significantly lower compared to the defect formation energy on the Ti or Sn sites.

Having two atoms as alloying elements is more complicated because of the added extra degree of freedom where the alloying elements can be placed. For example, one of the Fe atoms can be placed on a vacancy site of the NiTiSn. The second Fe atom can go on one of the four sites, Ni, Ti, Sn, or vacancy, that are nearest neighbors (NNs) to the first Fe atom, or on one of the four sites that are second NNs, and so on. The distance between two alloying elements were considered only up to the second NN. Summarized in Table 3 are the calculated defect formation energies for the NiTiSn with two Fe atoms as alloying elements. In Table 3, the sublattices column notes the alloyed sublattices (e.g. Ni and Ni, Ni and Sn etc.), the NN column shows if the alloying Fe atoms are placed as first or second NNs, and the third column is the defect formation energy. The energy of the alloying on Ni and Vac sublattices is significantly lower compared to energy of alloying at any other combination of sublattices, showing that it is the most energetically favorable way of HH/FH mixing. Moreover, substituting the Ni atom with Fe and having one Fe atom on the first NN vacancy site is the most favorable configuration (shown in bold in Table 3).

TABLE 3

Defect formation energies (in eV) for two Fe atoms in a NiTiSn matrix. Shown in bold are the lowest defect formation energy and the corresponding alloying sublattices and NN position of the Fe atoms.

| Sublattices | NN | $\Delta E_f^A$ |
|---|---|---|
| Ni Ni | First | 2.34 |
| Ni Ni | Second | 2.30 |
| Ni Sn | First | 3.13 |
| Ni Sn | Second | 3.91 |
| Ni Ti | First | 2.44 |
| Ni Ti | Second | 2.72 |
| Ni Vac | First | 0.71 |
| Ni Vac | Second | 0.87 |
| Sn Vac | First | 2.50 |
| Sn Vac | Second | 3.94 |
| Sn Sn | First | 6.54 |
| Sn Sn | Second | 6.63 |
| Ti Sn | First | 4.28 |
| Ti Sn | Second | 5.59 |
| Ti Ti | First | 3.47 |
| Ti Ti | Second | 3.52 |
| Ti Vac | First | 2.11 |
| Ti Vac | Second | 3.48 |
| Vac Vac | First | 1.23 |
| Vac Vac | Second | 1.31 |

Interestingly, the structure with one Fe atom on a Ni site and the other Fe atom on a vacancy site is non-magnetic, in contrast to the structures alloyed on two vacancy sites and on two Ni sites, with the latter two being magnetic. COHP analysis shows that the magnetic configuration significantly weakens the Fe—Ti and Fe—Ni bonds in the Fe alloyed NiTiSn compared to the non-magnetic configuration and hence increases the energy of the whole system. This decrease in the bonding strength between Fe—Ni and Fe—Ti is the main reason for the considerably higher defect formation energy of NiTiSn alloyed with two Fe atoms on Ni and vacancy sites compared to NiTiSn alloyed on two vacancy sites or two Ni sites.

Mixing Energy Intervals

Because the main interest is to find matrix/NS phase pairs that can phase separate at typical processing temperatures, having a very high or very low solubility is impractical. If the solubility is too high, there will be little driving force for phase separation at reasonable temperatures, and if the solubility is too low, it will be difficult to incorporate the alloying elements in the material to begin with. Therefore, it is meaningful to find a mixing energy interval in which the solubility of the two compounds at elevated temperatures (e.g. typical processing temperatures between the solvus boundary and melting point of the host matrix) is high enough for the two compounds to mix, but at lower temperatures the solubility is low enough to facilitate phase separation. To estimate this interval of mixing energies, $\Delta E_{mix}$, that promotes a favorable formation of two-phase NS material (NSing energy interval), the solvus of a solute i, $x_i(T)$ was calculated using the following expression: (Asta, M. et al., *Phys. Rev. B* 2001, 64, 094104-094107.)

$$x_i(T) = \exp\left[\frac{\Delta S_{vib}}{k_b}\right]\exp\left[-\frac{\Delta E_{mix}}{k_b T}\right] \quad (5)$$

where $k_b$ and T are the Boltzmann constant and the thermodynamic temperature, respectively. $\Delta S_{vib}$ is the vibrational entropy, defined as:

$$\Delta S_{vib} = k_b \int_0^{v_{max}} \ln\left(\frac{k_b T}{hv}\right)\Delta D(v)dv \quad (6)$$

where h is the Planck's constant and ν is the phonon frequency. $\Delta D(v)$ is the composition weighted phonon density of states (DOS), given by:

$$\Delta D(v) = D^{XY(A)Z}(v) - \frac{N_Y - 1}{N_Y}D^{XYZ}(v) - \frac{1}{N_Y}D^{XAZ}(v)$$

where $D^{XY(A)Z}(v)$, $D^{XYZ}(v)$, and $D^{XAZ}(v)$ are the DFT phonon DOS of the XYZ supercell with 1 mixing atom and the supercells of pure XYZ and XAZ, respectively, and $N_Y$ is the number of atoms in a particular sublattice. Calculating the vibrational entropy for every matrix/NS phase pair is very computationally demanding and time consuming. Thus, 5 matrix/NS phase pairs were considered: $Co_2TiSn/Fe_2TiSn$, $NiTiSn/NiZrSn$, $NiZrSn/NiTiSn$, $Fe_2TiAl/Fe_2TiSn$, and $Fe_2TiSn/Fe_2TiAl$, representing the mixing on X, Y, and Z sites, for which the vibrational entropy was calculated.

Figure 5A:
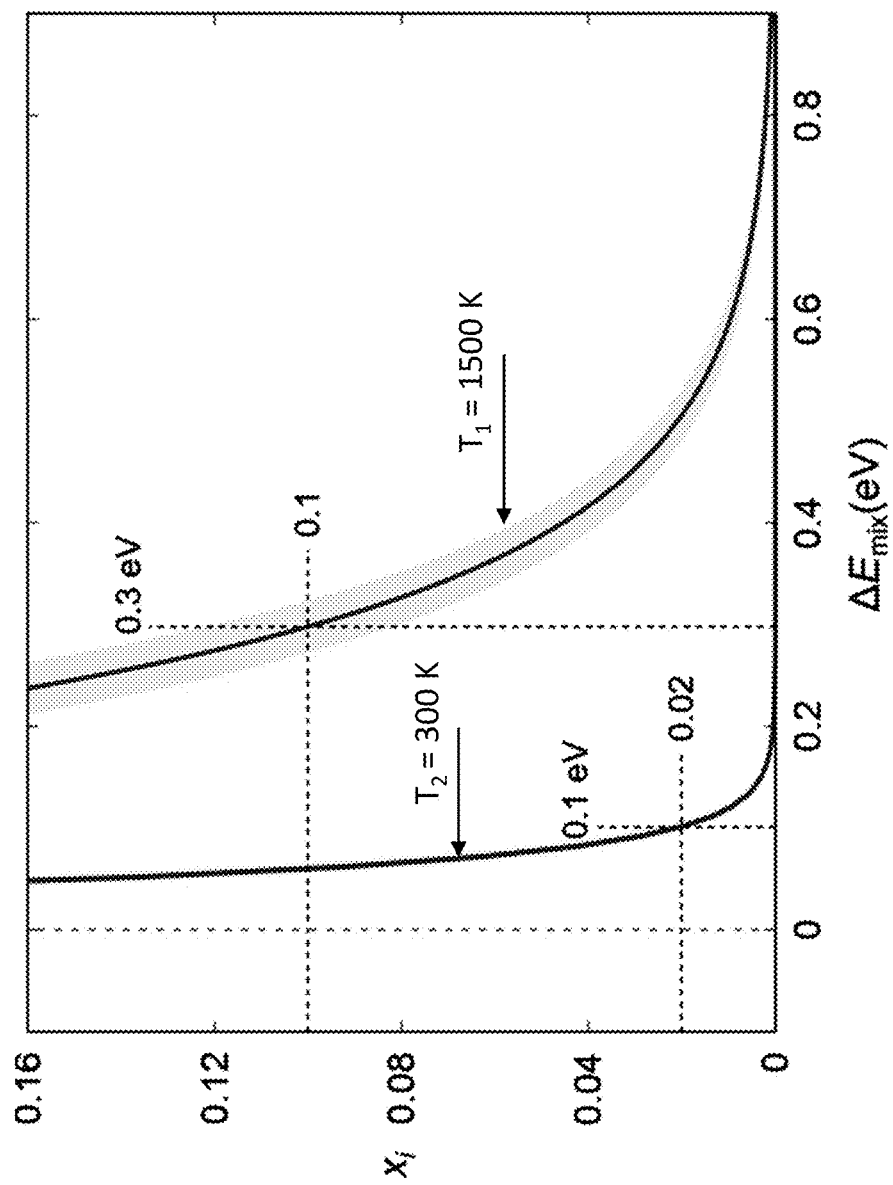
FIG. 5A shows the solvus of component i ($x_i$) as a function of the mixing energy ($\Delta E_{mix}$) at two different temperatures: $T_1$=1500 K and $T_2$=300 K, calculated using Eq. 7 of the Example. The shaded area represents the uncertainty in the solvus if $\Delta S_{vib}$ of ±0.2 $k_b$ is considered. The dashed lines show the $x_i$ and the corresponding $\Delta E_{mix}$ values that define the NSing energy interval.

It is known that the experimental solvus in various Al alloys can be very well represented when the vibrational entropy is considered when calculating the solvus. In the case of mixing between two Heusler compounds, only two studies detailed the phase diagram of NiTiSn with excess Ni. (Gürth, M. et al., *RSC Adv.* 2015, 5, 92270-92291; Verma, N. et al, *Metall. Mater. Trans. A* 2016, 47, 4116-4127.) However, the DFT calculations in this Example show that the $Ni_2TiSn$ is dynamically unstable at 0 K (has negative phonon frequencies); hence, it is difficult to compare the calculated vibrational entropy of the mixing between NiTiSn and Ni$_2$TiSn. Dynamical instability of Ni$_2$TiSn has been previously reported, and its origin was proposed to be the small size of the Ti 3d orbitals. (Page, A. et al., *Phys. Rev. B* 2015, 92, 174102-17412.) Nevertheless, the calculated vibrational entropies for all 5 cases considered are within ±0.2 k$_b$ interval, which has rather small effect on the solubility, especially at lower temperatures—see the shaded area in FIG. 5A. Thus, for estimating the NSing energy interval, the contribution from vibrational entropy was ignored, and the solubility was calculated using:

$$x_i \sim \exp\left[-\frac{\Delta E_{mix}}{k_bT}\right] \quad (7)$$

Figure 5B:
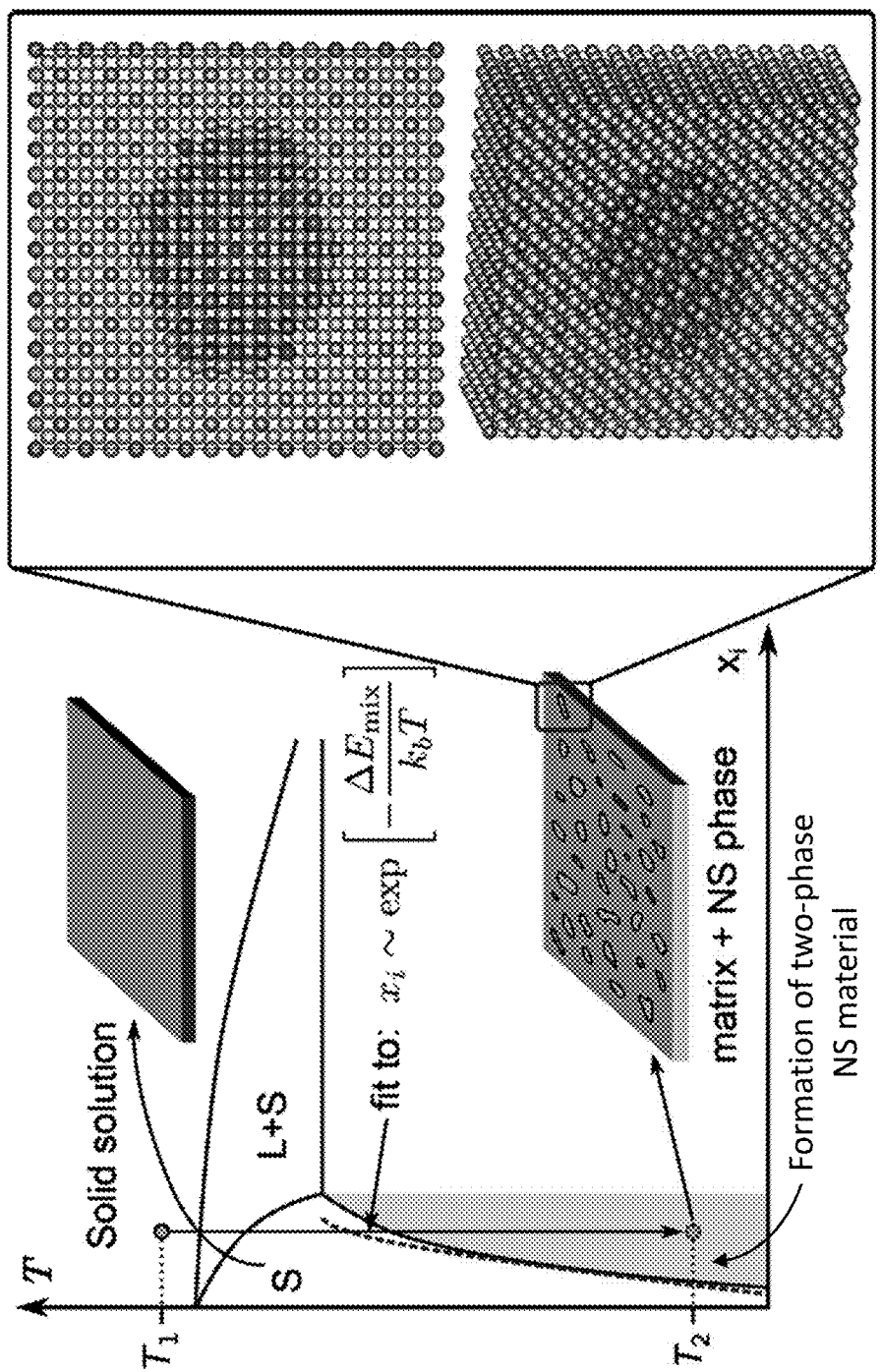
FIG. 5B shows a schematic representation of a phase diagram between two Heusler phases, matrix and NS phase, with the concentration of element i, $x_i$ on the x-axis. The arrow depicts a cooling of the liquid from $T_1$ to a solid two-phase NS material at $T_2$. The dashed curve represents the fit for the solvus. The shaded part depicts the region where formation of two-phase NS material is expected. An atomistic schematic representation of a host matrix with a NS phase (FH host matrix and HH NS phase) is also shown.

The lower limit for the NSing energy interval was obtained by specifying that the solubility of the NS phase should be at most 2% at 300 K, yielding a value of 0.1 eV. It is thought that having low miscibility is advantageous for the formation of Ni(Zr,Hf)Sn nanostructures in a Ni(Zr,Hf)Sn host matrix. The upper limit was set to 0.26 eV, a value that corresponds to solubility higher than 10% at 1500 K, close to the melting temperature of Heusler compounds. These criteria for choosing the lower and upper NSing energy intervals are graphically depicted by the crossing of dashed lines in FIG. 5A. As discussed at the beginning of this section, the NSing interval is chosen in such way that allows for a sufficient amount of the NS phase to be dissolved at high temperature, T$_1$, but because of the significantly smaller solubility at low temperature, T$_2$, once quenched the NS phase will separate forming nanostructures. This idea is schematically represented in FIG. 5B, also showing an atomistic schematic representation of a host matrix with a NS phase.

The choice of energy interval is an estimate, as it is based on the amount of NS phase often used experimentally and the temperatures at which the Heusler two-phase NS materials are synthesized. It is also important to note that in experiments of mixing between NiTiSn and Ni$_2$TiSn, an obvious formation of Ni$_2$TiSn NS in the NiTiSn matrix has been reported, which experimentalists argue is indicative of sufficient mutual solubility of Ni$_2$TiSn in NiTiSn. The calculations in this Example show a defect formation energy of 0.23 eV for alloying of Ni on a vacancy site in NiTiSn (which corresponds to a composition on the tie-line between NiTiSn and Ni$_2$TiSn), see "Alloying of Heusler Compounds"). The defect formation energy is within the proposed NS energy interval, indicating that a two-phase system with mixing energy within the proposed NS energy interval can probably form nanostructured material. However, it is noted that the idea behind the solubility criteria is quite general, and the mixing energies reported can be utilized for a screening using different temperature and concentration conditions. Nevertheless, indicating an energy interval in which nanostructuring is expected to occur helps guide the screening strategy toward systems that experimentally should form two-phase NS materials. In this way, the matrix/NS phase pairs can be divided in four distinct categories: (I) a stable quaternary compound exists (negative mixing energy), (II) compounds that have a very high solubility (mixing energy below the lower NSing limit), (III) possibility for forming two-phase NS materials (mixing energy within the NSing interval), and (IV) compounds that form stable interfaces (mixing energy higher than the upper NSing limit).

Mixing in Half Heusler Host Matrices

Figure 6:
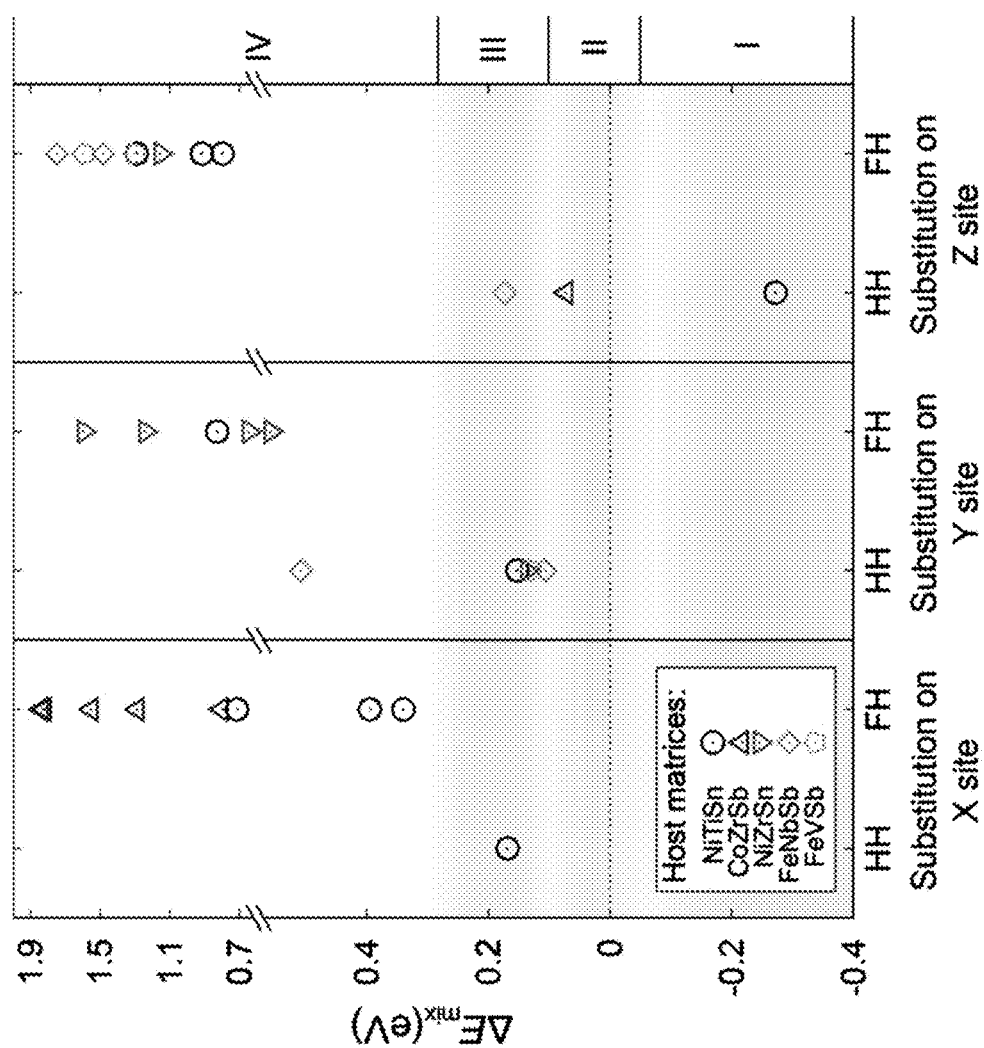
FIG. 6 shows mixing energy, $\Delta E_{mix}$, of half Heusler host matrices as a function of the mixing site and the structure of the NS phase (half Heusler (HH) or full Heusler (FH)). The shaded regions represent the categories: I) having stable quaternary compound, II) high solubility, III) NSing (the interval of interest), and IV) having stable interface, respectively.

The study of the nanostructuring in Heusler compounds was begun by analyzing the mixing between the HH matrices (NiTiSn, NiZrSn, CoTiSb, FeVSb, and FeNbSb) and compounds that were found to have tie-lines with the host matrices. For each of the matrix/NS phase pairs, the mixing energies were calculated as in Eq. 2, using a 48-atom supercell, where the NS phases were mixed in the host matrix as detailed in "Methodology." The calculated mixing energies are summarized in Table 4. It is noticeable that there is a wide spread of mixing energies, with only one matrix/NS phase pair, NiTiSn/NiTiSb, having negative mixing energy, i.e., NiTiSn and NiTiSb show a significantly negative mixing energy, and hence should favorably mix to form a (currently unknown) quaternary compound. Better qualitative insight into the changes in the mixing energy with the various NS phases can be gained by plotting the mixing energies as a function of the mixing sublattice (X, Y, or Z) site and the type of NS phases, HH or FH, as shown in FIG. 6.

TABLE 4

Mixing energies (in eV) of half Heusler matrices and various NS phases, arranged in ascending order of mixing energies (increasingly unfavorable for mixing)[a]

| host matrix | NS compound | $\Delta E_{mix}$ |
|---|---|---|
| NiTiSn | NiTiSb | −0.27 |
|  | NiZrSn | 0.15 |
|  | PtTiSn | 0.17 |
|  | Co$_2$TiSn | 0.34 |
|  | Ni$_2$TiSn | 0.39 |
|  | Fe$_2$TiSn | 0.71 |
|  | Ni$_2$TiIn | 0.80 |
|  | Ni$_2$MgSn | 0.83 |
|  | Ni$_2$TiGa | 0.91 |
|  | Ni$_2$TiZn | 1.29 |
| CoTiSb | NiTiSb | 0.07 |
|  | Co$_2$TiSn | 0.80 |
|  | Co$_2$TiIn | 1.28 |
|  | Co$_2$TiGa | 1.55 |
|  | Co$_2$TiAl | 1.82 |
|  | Co$_2$TiZn | 1.83 |
|  | Co$_2$TiMn | 2.42 |
| FeVSb | FeNbSb | 0.13 |
|  | Fe$_2$VGa | 1.30 |
|  | Fe$_2$VAl | 1.59 |
| NiZrSn | NiTiSn | 0.14 |
|  | Ni$_2$HfSn | 0.56 |
|  | Ni$_2$TmSn | 0.56 |
|  | Ni$_2$ScSn | 0.65 |
|  | Ni$_2$ZrAl | 1.14 |
|  | Ni$_2$MgSn | 1.24 |
|  | Ni$_2$LiSn | 1.60 |
| FeNbSb | FeVSb | 0.11 |
|  | RuNbSb | 0.17 |
|  | Fe$_2$NbGa | 1.48 |
|  | Fe$_2$NbAl | 1.74 |

[a]Shown in bold are the compounds with a mixing energy within the Nsing energy interval, defined based on the solubility model (see discussion in "Mixing Energy Intervals" of the Example).

FIG. 6 shows that in all cases considered, the mixing between a HH matrix and a HH compound has significantly lower energy compared to the mixing energy of a HH matrix and a FH compound, indicating that the solubility of a HH compound into a HH matrix is greater than the solubility of a FH compound in a HH matrix. Additionally, all of the HH/FH matrix/NS phase pairs fall within category IV, suggesting that the two compounds will form very stable interfaces with very low intermixing, thus providing the possibility to be utilized in devices where stable interfaces are required, e.g. superlattices. As mentioned previously, only one of the pairs, NiTiSn/NiTiSb, is within category I. Also, only one pair, CoTiSb/NiTiSb, can be placed in category II, suggesting that these compounds have a very low-temperature miscibility gap and hence extremely high solubility. Lastly, 6 matrix/NS pairs have mixing energy within the NSing energy interval—category III. Two of those pairs, NiTiSn/NiZrSn and NiZrSn/NiTiSn, have been previously shown to form two-phase NS materials. (Bhattacharya, S. et al., *Phys. Rev. B* 2008, 77, 184203-184210; Appel, O. et al., *J. Electron. Mater.* 2013, 42, 1340-1345; Schwall, M. et al., *Phys. Chem. Chem. Phys.* 2013, 15, 1868-1872; Populoh, S. et al., *Scr. Mater.* 2012, 66, 1073-1076, Viewpoint Set no. 50: Twinning Induced PlasticitySteels.) $NiTi_{0.75}Zr_{0.25}Sn$ forms distinct Zr-rich regions ~1 µm in size, and in the case of $NiTi_xZr_yHf_{1-x-y}Sn$ (with 0.3<x<0.5 and 0.25<y<0.37), a clear separation between Ti-rich and (Zr,Hf)-rich regions has been reported. The other four pairs with mixing energy within the NS energy interval, NiTiSn/PtTiSn, FeVSb/FeNbSb, FeNbSb/FeVSb, and FeNbSb/RuNbSb, have not yet been studied.

Mixing in Full Heusler Host Matrices

Figure 7:
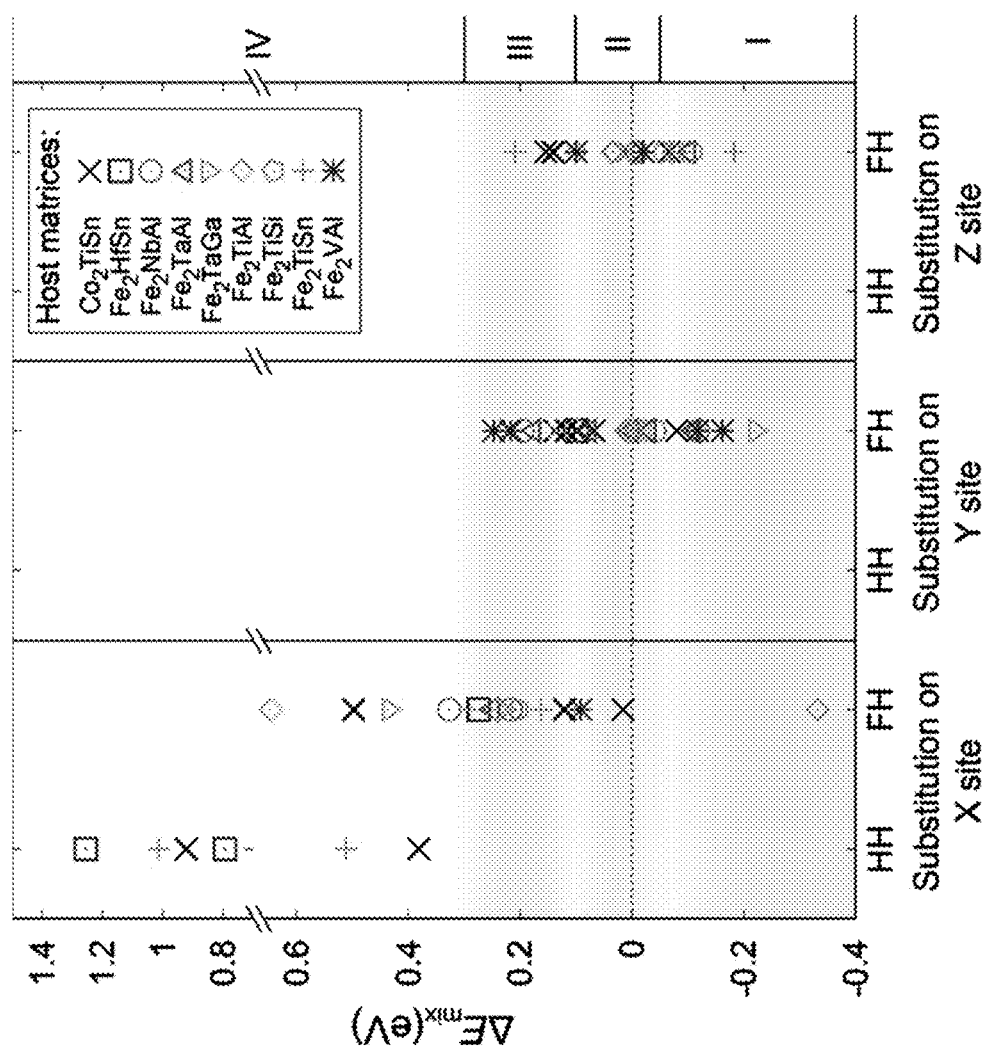
FIG. 7 shows mixing energy, $\Delta E_{mix}$, of full Heusler host matrices as a function of the mixing site and the structure of the NS phase (half Heusler (HH) or full Heusler (FH)). The shaded regions represent the categories: I) having stable quaternary compound, II) high solubility, III) NSing (the interval of interest), and IV) having stable interface, respectively.

The study is further extended to the mixing of the FH matrices: $Co_2TiSn$, $Fe_2HfSn$, $Fe_2NbAl$, $Fe_2TaAl$, $Fe_2TiAl$, $Fe_2TiSi$, $Fe_2TaGa$, $Fe_2TiSn$, and $Fe_2VAl$, with different compounds as possible NS phases. For each of the matrix/NS phase pair, the mixing energies were calculated using Eq. 2, and the calculated mixing energies are shown in Table 5. As in the case of the HH matrices, for a better overview in which of the 4 categories the matrix/NS phase pair can be placed, the mixing energies are plotted as a function of mixing site and type of NS phase—see FIG. 7. It is noticeable that the mixing energies of the FH/FH systems are typically lower compared to the mixing energies between FH/HH pairs, which are similar to the mixing in HH matrices, where HH/HH mixing has lower energy. However, there are a larger number of pairs that have mixing energy in the NSing energy interval (category III) and in a high solubility interval (category II). From the whole list of pairs, 25 FH matrix/NS phase pairs have mixing energy within the NSing energy interval. For a clearer separation from the other matrix/NS pairs, the 25 FH matrix/NS phase pairs that have mixing energy within the NSing energy interval are given in Table 6, together with the 6 HH matrix/NS phase pairs from Table 4.

TABLE 5

Mixing energies (in eV) of full Heusler host matrix and various Heusler compounds as NS phase, arranged in ascending order of mixing energies (increasingly unfavorable for mixing)[a]

| Host matrix | NS compound | $\Delta E_{mix}$ |
|---|---|---|
| $Co_2TiSn$ | $Co_2ScSn$ | −0.08 |
| | $Co_2TiIn$ | −0.07 |
| | $Fe_2TiSn$ | 0.02 |
| | $Co_2LuSn$ | 0.07 |
| | $Co_2HfSn$ | 0.10 |
| | $Co_2MnSn$ | 0.12 |
| | $Rh_2TiSn$ | 0.12 |
| | $Co_2ZrSn$ | 0.14 |
| | $Co_2TiGa$ | 0.14 |
| | $Co_2TiAl$ | 0.15 |
| | NiTiSn | 0.38 |
| | $Ru_2TiSn$ | 0.50 |
| | PtTiSn | 0.92 |
| $Fe_2TiAl$ | $Fe_2WAl$ | −0.72 |
| | $Cu_2TiAl$ | −0.33 |

TABLE 5-continued

Mixing energies (in eV) of full Heusler host matrix and various Heusler compounds as NS phase, arranged in ascending order of mixing energies (increasingly unfavorable for mixing)[a]

| Host matrix | NS compound | $\Delta E_{mix}$ |
|---|---|---|
| | $Fe_2TiGe$ | −0.07 |
| | $Fe_2MnAl$ | −0.02 |
| | $Fe_2VAl$ | −0.01 |
| | $Fe_2TiGa$ | −0.01 |
| | $Fe_2NbAl$ | 0.00 |
| | $Fe_2TaAl$ | 0.01 |
| | $Fe_2TiSi$ | 0.04 |
| | $Fe_2TiSn$ | 0.10 |
| | $Ru_2TiAl$ | 0.24 |
| | $Mn_2TiAl$ | 0.64 |
| $Fe_2HfSn$ | $Fe_2TiSn$ | 0.10 |
| | $Ru_2HfSn$ | 0.27 |
| | PdHfSn | 0.79 |
| | PtHfSn | 1.25 |
| $Fe_2NbAl$ | $Fe_2TiAl$ | −0.12 |
| | $Fe_2WAl$ | −0.04 |
| | $Fe_2NbGa$ | −0.01 |
| | $Fe_2TaAl$ | 0.00 |
| | $Fe_2MnAl$ | 0.10 |
| | $Fe_2VAl$ | 0.19 |
| | $Co_2NbAl$ | 0.22 |
| | $Mn_2NbAl$ | 0.33 |
| | FeNbSb | 1.59 |
| $Fe_2TiSi$ | $Fe_2TiAl$ | −0.11 |
| | $Fe_2TiGa$ | −0.06 |
| | $Fe_2TiGe$ | 0.03 |
| | $Mn_2TiSi$ | 0.20 |
| | $Fe_2CoSi$ | 1.39 |
| $Fe_2TaAl$ | $Fe_2TiAl$ | −0.11 |
| | $Fe_2TaGe$ | −0.10 |
| | $Fe_2WAl$ | −0.03 |
| | $Fe_2TaGa$ | −0.01 |
| | $Fe_2NbAl$ | 0.00 |
| | $Fe_2MnAl$ | 0.08 |
| | $Fe_2VAl$ | 0.18 |
| | $Co_2TaAl$ | 0.25 |
| $Fe_2TaGa$ | $Fe_2TiGa$ | −0.22 |
| | $Fe_2TaGe$ | −0.08 |
| | $Fe_2TaAl$ | −0.01 |
| | $Fe_2NbGa$ | 0.00 |
| | $Fe_2VGa$ | 0.15 |
| | $Co_2TaGa$ | 0.23 |
| | $Ru_2TaGa$ | 0.44 |
| | PtTaGa | 2.00 |
| $Fe_2TiSn$ | $Fe_2TiAl$ | −0.18 |
| | $Fe_2TiGa$ | −0.09 |
| | $Fe_2HfSn$ | 0.12 |
| | $Co_2TiSn$ | 0.16 |
| | $Fe_2TiGe$ | 0.21 |
| | $Ru_2TiSn$ | 0.29 |
| | NiTiSn | 0.51 |
| | PtTiSn | 1.01 |
| $Fe_2VAl$ | $Fe_2TiAl$ | −0.16 |
| | $Fe_2MnAl$ | −0.12 |
| | $Fe_2WAl$ | −0.12 |
| | $Fe_2VGa$ | −0.02 |
| | $Co_2VAl$ | 0.09 |
| | $Fe_2VBe$ | 0.10 |
| | $Fe_2TaAl$ | 0.22 |
| | $Fe_2NbAl$ | 0.25 |

[a]Shown in bold are the compounds with a mixing energy within the NSing energy interval, defined based on the solubility model (see discussion in "Mixing Energy Intervals" of the Example).

It is interesting to note that in the case of the matrix/NS phase pairs with mixing energy in the NSing energy interval, the two elements being substituted are isovalent or there is a change of ±1 in the number of valence electrons between the two elements. Additionally, substituting elements with small difference in their electronegativities and/or atomic radii is favorable for forming two-phase NS materials. Moreover, the lattice mismatch between the matrix and NS phase that are within the NSing interval is small, <3%, which indicates a high probability of forming a coherent interface between the matrix and the NS phase. For example, in the HH/FH two-phase system [Ni(Zr,Hf)Sn/Ni$_2$(Zr,Hf)Sn], a small lattice mismatch (2.5%-5%) has been credited to the formation of coherent boundaries between the FH/NS phase and the HH host matrix. (Liu, Y. et al., *J. Am. Chem. Soc.* 2013, 135, 7486-7495.)

TABLE 6

Matrix/NS phase pairs that are predicted to favor formation of two-phase NS materials (pairs with mixing energy within the NSing energy interval, defined based on the solubility model - see discussion in "Mixing Energy Intervals," above).

| HH matrices | | FH matrices | | | | | | | |
|---|---|---|---|---|---|---|---|---|---|
| Matrix | NS comp. | Matrix | NS comp. | Matrix | NS comp. | Matrix | NS comp. | Matrix | NS comp. |
| NiTiSn | NiZrSn | Co$_2$TiSn | Co$_2$HfSn | Fe$_2$TiAl | Fe$_2$TiSn | Fe$_2$TiSi | Mn$_2$TiSi | Fe$_2$TiSn | Fe$_2$HfSn |
|  | PtTiSn |  | Co$_2$MnSn |  | Ru$_2$TiAl | Fe$_2$TaAl | Fe$_2$VAl |  | Co$_2$TiSn |
| NiZrSn | NiTiSn |  | Rh$_2$TiSn | Fe$_2$HfSn | Fe$_2$TiSn |  | Co$_2$TaAl |  | Fe$_2$TiGe |
| FeVSb | FeNbSb |  | Co$_2$ZrSn |  | Ru$_2$HfSn | Fe$_2$VAl | Fe$_2$VBe |  | Ru$_2$TiSn |
| FeNbSb | FeVSb |  | Co$_2$TiGa | Fe$_2$NbAl | Fe$_2$MnAl |  | Fe$_2$TaAl | Fe$_2$TaGa | Fe$_2$VGa |
|  | RuNbSb |  | Co$_2$TiAl |  | Fe$_2$VAl |  | Fe$_2$NbAl |  | Co$_2$TaGa |
|  |  |  |  |  | Co$_2$NbAl |  |  |  |  |

Conclusions

Heusler compounds have been emerging as vital thermoelectric materials whose efficiency can be significantly increased by nanostructuring. Utilizing the predictive power of first-principles calculations can considerably speed up the process of finding new compounds that can be precipitated as nanostructures within a Heusler matrix. In this Example, screening was first done for convex hull tie-lines, indicating a stable two-phase equilibrium between HH and FH compounds that are known to exhibit favorable thermoelectric properties as well as between every HH, FH, and IH in the OQMD, arriving at 106 unique matrix/NS phase pairs. For each of these matrix/NS phase pairs, the mixing energies were calculated and the solubility window in which nanostructures are expected to form was estimated.

It has been shown that matrix/NS pairs consisting of distinct crystal structures (e.g. mixing of HH with FH) typically have low mutual solubility, thus favoring the formation of stable interfaces with very low intermixing. On the other hand, the Heusler compounds of the same type (HH mixing with HH or FH mixing with FH) can either form two-phase NS materials, have very high solubility, or can form stable quaternary compounds. Moreover, 31 matrix/NS phase pairs were found that have mixing energy within the proposed mixing energy interval that favors formation of two-phase NS materials. There are several pairs that are believed to be of immediate interest, such as the FeVSb/FeNbSb and Fe$_2$TiSn/Fe$_2$HfSn mixtures, with a large mass difference between the mixing atoms, and the Fe$_2$TiSi/Mn$_2$TiSi pair, where the Mn atoms can serve as the dopant. Additionally, the lattice mismatch between the matrix and the NS phases in the predicted 31 pairs is low (<3%), thus indicating possible formation of a coherent interface, mostly preserving the favorable electrical properties of the host matrices.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the present disclosure has been presented for purposes of illustration and of description. It is not intended to be exhaustive or to limit the present disclosure to the precise form disclosed, and modifications and variations are possible in light of the above teachings or may be acquired from practice of the present disclosure. The embodiments were chosen and described in order to explain the principles of the present disclosure and as practical applications of the present disclosure to enable one skilled in the art to utilize the present disclosure in various embodiments and with various modifications as suited to the particular use contemplated. It is intended that the scope of the present disclosure be defined by the claims appended hereto and their equivalents.

What is claimed is:

1. A thermoelectric material composed of an isostructural pair of Heusler compounds, either a pair of full Heusler (FH) X$_2$YZ compounds or a pair of half Heusler (HH) XYZ compounds, wherein, in the FH pair, a first compound of the pair has the formula (X1)$_2$Y1Z1, wherein X1 is selected from Fe and Co; Y1 is selected from Ti, V, Nb, Hf, and Ta; and Z1 is selected from Al, Ga, Si, and Sn and a second compound of the pair has the formula (X2)$_2$Y2Z2, wherein X2 is selected from Mn, Fe, Co, Ru, and Rh; Y2 is selected from Ti, V, Mn, Zr, Nb, Hf, and Ta; and Z2 is selected from Be, Al, Ga, Si, Ge and Sn, wherein the first and second compounds of the pair share two elements in common and have third elements which are different and are either isovalent or have a valency which differs by ±1;

wherein, in the HH pair, a first compound of the pair has the formula X1Y1Z1 wherein X1 is selected from Ni and Fe; Y1 is selected from Ti, V, and Nb; and Z1 is selected from Sn and Sb and a second compound of the pair has the formula X2Y2Z2 wherein X2 is selected from Fe, Ru and Pt; Y2 is selected from Ti, V, and Nb; and Z2 is selected from Sn and Sb, wherein the first and second compounds of the pair share two elements in common and have third elements which are different and are either isovalent or have a valency which differs by ±1; and further wherein the thermoelectric material at room temperature has a nanostructured two-phase form having a matrix phase composed of the first compound of the FH pair or the first compound of the HH pair and a nanostructured phase composed of the second compound of the FH pair or the second compound of the HH pair, respectively, wherein the nanostructured phase is composed of a plurality of randomly oriented nanoscale islands dispersed throughout the matrix phase.

2. The thermoelectric material of claim 1, composed of the FH pair.

3. The thermoelectric material of claim 2, wherein X1 is Co; Y1 is Ti; and Z1 is Sn.

4. The thermoelectric material of claim 3, wherein X2 is Co; Y2 is selected from Ti, Mn, Zr, Nb, Hf, and Ta; and Z2 is selected from Al, Ga, and Sn; or
X2 is Rh; Y2 is Ti; and Z2 is Sn.

5. The thermoelectric material of claim 4, wherein the first compound of the FH pair is $Co_2TiSn$ and the second compound of the FH pair is $Co_2HfSn$; $Co_2MnSn$; $Rh_2TiSn$; $Co_2ZrSn$; $Co_2TiGa$; or $Co_2TiAl$.

6. The thermoelectric material of claim 2, wherein X1 is Fe; Y1 is selected from V, Nb, Hf, and Ta; and Z is selected from Al, Ga, Si, and Sn.

7. The thermoelectric material of claim 6, wherein X2 is Co; Y2 is selected from Ti, Mn, Zr, Nb, Hf, and Ta; and Z2 is selected from Al, Ga, and Sn; or
X2 is Fe; Y2 is selected from Ti, V, Mn, Nb, Hf, and Ta; and Z2 is selected from Be, Al, Ga, Ge, and Sn; or
X2 is Ru; Y2 is selected from Ti and Hf; and Z2 is selected from Al and Sn; or
X2 is Mn; Y2 is Ti; and Z2 is Si.

8. The thermoelectric material of claim 7, wherein the first compound of the FH pair is $Fe_2TiAl$ and the second compound of the FH pair is $Fe_2TiSn$ or $Ru_2TiAl$.

9. The thermoelectric material of claim 7, wherein the first compound of the FH pair is $Fe_2HfSn$ and the second compound of the FH pair is $Fe_2TiSn$ or $Ru_2HfSn$.

10. The thermoelectric material of claim 7, wherein the first compound of the FH pair is $Fe_2NbAl$ and the second compound of the FH pair is $Fe_2MnAl$, $Fe_2VAl$, or $Co_2NbAl$.

11. The thermoelectric material of claim 7, wherein the first compound of the FH pair is $Fe_2TiSi$ and the second compound of the FH pair is $Mn_2TiSi$.

12. The thermoelectric material of claim 7, wherein the first compound of the FH pair is $Fe_2TaAl$ and the second compound of the FH pair is $Fe_2VAl$ or $Co_2TaAl$.

13. The thermoelectric material of claim 7, wherein the first compound of the FH pair is $Fe_2VAl$ and the second compound of the FH pair is $Fe_2VBe$, $Fe_2TaAl$, or $Fe_2NbAl$.

14. The thermoelectric material of claim 7, wherein the first compound of the FH pair is $Fe_2TiSn$ and the second compound of the FH pair is $Fe_2HfSn$, $Co_2TiSn$, $Fe_2TiGe$, or $Ru_2TiSn$.

15. The thermoelectric material of claim 7, wherein the first compound of the FH pair is $Fe_2TaGa$ and the second compound of the FH pair is $Fe_2VGa$ or $Co_2TaGa$.

16. The thermoelectric material of claim 1, composed of the HH pair.

17. The thermoelectric material of claim 16, wherein X1 is Ni; Y1 is Ti; and Z1 is Sn.

18. The thermoelectric material of claim 17, wherein the first compound of the HH pair is NiTiSn and the second compound of the HH pair is PtTiSn.

19. The thermoelectric material of claim 16, wherein X1 is Fe; Y1 is V or Nb; and Z1 is Sb.

20. The thermoelectric material of claim 19, wherein X2 is Fe; Y2 is V or Nb; and Z2 is Sb; or
X2 is Ru; Y2 is Nb; and Z2 is Sb.

21. The thermoelectric material of claim 20, wherein the first compound of the HH pair is FeVSb and the second compound of the HH pair is FeNbSb; or wherein the first compound of the HH pair is FeNbSb and the second compound of the HH pair is FeVSb or RuNbSb.

22. A thermoelectric device comprising a first insulating plate, a second insulating plate and the thermoelectric material of claim 1 between the first and second insulating plates.

23. A thermoelectric material composed of an isostructural pair of Heusler compounds, either a pair of full Heusler (FH) $X_2YZ$ compounds or a pair of half Heusler (HH) XYZ compounds,
wherein the FH pair is selected from $Co_2TiSn/Co_2HfSn$; $Co_2TiSn/Co_2MnSn$; $Co_2TiSn/Rh_2TiSn$; $Co_2TiSn/Co_2ZrSn$; $Co_2TiSn/Co_2TiGa$; $Co_2TiSn/Co_2TiAl$; $Fe_2TiAl/Fe_2TiSn$; $Fe_2TiAl/Ru_2TiAl$; $Fe_2HfSn/Fe_2TiSn$; $Fe_2HfSn/Ru_2HfSn$; $Fe_2NbAl/Fe_2MnAl$; $Fe_2NbAl/Fe_2VAl$; $Fe_2NbAl/Co_2NbAl$; $Fe_2TiSi/Mn_2TiSi$; $Fe_2TaAl/Fe_2VAl$; $Fe_2TaAl/Co_2TaAl$; $Fe_2VAl/Fe_2VBe$; $Fe_2VAl/Fe_2TaAl$; $Fe_2VAl/Fe_2NbAl$; $Fe_2TiSn/Fe_2HfSn$; $Fe_2TiSn/Co_2TiSn$, $Fe_2TiSn/Fe_2TiGe$; $Fe_2TiSn/Ru_2TiSn$; $Fe_2TaGa/Fe_2VGa$; and $Fe_2TaGa/Co_2TaGa$; and
wherein the HH pair is selected from NiTiSn/PtTiSn; FeVSb/FeNbSb; FeNbSb/FeVSb; and FeNbSb/RuNbSb, wherein the thermoelectric material at room temperature has a nanostructured two-phase form having a matrix phase composed of a first compound of the FH pair or a first compound of the HH pair and a nanostructured phase composed of a second compound of the FH pair or a second compound of the HH pair, respectively, wherein the nanostructured phase is composed of a plurality of randomly oriented nanoscale islands dispersed throughout the matrix phase.

* * * * *